US 12,439,608 B2

(12) United States Patent
Xie et al.

(10) Patent No.: US 12,439,608 B2
(45) Date of Patent: Oct. 7, 2025

(54) MRAM INTEGRATION WITH SELF-ALIGNED DIRECT BACK SIDE CONTACT

(71) Applicant: International Business Machines Corporation, Armonk, NY (US)

(72) Inventors: Ruilong Xie, Niskayuna, NY (US); Nicholas Anthony Lanzillo, Wynantskill, NY (US); Koichi Motoyama, Clifton Park, NY (US); Brent A. Anderson, Jericho, VT (US); Michael Rizzolo, Delmar, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 521 days.

(21) Appl. No.: 17/884,002

(22) Filed: Aug. 9, 2022

(65) Prior Publication Data

US 2024/0057345 A1    Feb. 15, 2024

(51) Int. Cl.
| | | |
|---|---|---|
| *H10B 61/00* | (2023.01) | |
| *H10D 30/00* | (2025.01) | |
| *H10N 50/01* | (2023.01) | |
| *H10N 50/10* | (2023.01) | |
| *H10N 50/80* | (2023.01) | |

(Continued)

(52) U.S. Cl.
CPC ........... *H10B 61/22* (2023.02); *H10D 30/501* (2025.01); *H10N 50/01* (2023.02); *H10N 50/80* (2023.02); *H10N 59/00* (2023.02); *H10B 63/30* (2023.02); *H10N 50/10* (2023.02)

(58) Field of Classification Search
CPC ........ H10N 50/80; H10B 61/22; H10B 63/30; H01L 27/228; H01L 43/02; H01L 433/12
See application file for complete search history.

(56) References Cited

U.S. PATENT DOCUMENTS

| | | |
|---|---|---|
| 9,093,316 B2 | 7/2015 | Kuroda |
| 9,786,839 B2 | 10/2017 | Bhushan et al. |

(Continued)

FOREIGN PATENT DOCUMENTS

| | | |
|---|---|---|
| CN | 109983594 A | 7/2019 |
| CN | 113178444 A | 7/2021 |

(Continued)

OTHER PUBLICATIONS

International Search Report dated Nov. 1, 2023, received in a corresponding foreign application no., International Application No. PCT/CN2023/111422, 9 pages.

*Primary Examiner* — Davienne N Monbleau
*Assistant Examiner* — Emily Farmer
(74) *Attorney, Agent, or Firm* — Scully, Scott, Murphy & Presser, P.C.; Yuanmin Cai

(57) ABSTRACT

A back side contact structure is provided that directly connects a first electrode of a MRAM, which is present in a back side of a wafer, to a source/drain structure of a transistor. The back side contact is self-aligned to the source/drain structure of the transistor as well as to the first electrode of the MRAM. The close proximity between the MRAM and the source/drain structure increases the speed of the device. MRAM yield is not compromised since no re-sputtering of back side contact metal onto the MRAM occurs.

24 Claims, 20 Drawing Sheets

(51) Int. Cl.
*H10N 59/00* (2023.01)
*H10B 63/00* (2023.01)

(56) References Cited

U.S. PATENT DOCUMENTS

| | | | |
|---|---|---|---|
| 10,192,925 B2 | 1/2019 | Yokoyama et al. | |
| 10,319,785 B2 | 6/2019 | Yokoyama | |
| 10,615,334 B2 | 4/2020 | Umebayashi et al. | |
| 10,872,820 B2 | 12/2020 | Block et al. | |
| 10,879,299 B2 | 12/2020 | Yokoyama et al. | |
| 10,916,583 B2 | 2/2021 | Wang | |
| 11,043,532 B2 | 6/2021 | Yokoyama et al. | |
| 11,056,492 B1 | 7/2021 | Gomes et al. | |
| 11,101,318 B2 | 8/2021 | Kumar et al. | |
| 11,289,606 B2 | 3/2022 | Ju et al. | |
| 2018/0182809 A1* | 6/2018 | Liu | H10N 50/01 |
| 2021/0140099 A1* | 5/2021 | Wagner | D06M 17/00 |
| 2021/0159270 A1* | 5/2021 | Reznicek | H10N 50/01 |
| 2021/0167059 A1 | 6/2021 | Lee et al. | |
| 2021/0242399 A1* | 8/2021 | Lee | H10N 70/8413 |
| 2021/0351303 A1* | 11/2021 | Ju | H10D 30/6735 |
| 2022/0320180 A1* | 10/2022 | Liu | H10D 64/017 |
| 2024/0090235 A1 | 3/2024 | Tsai et al. | |

FOREIGN PATENT DOCUMENTS

| | | |
|---|---|---|
| CN | 114823508 A | 7/2022 |
| CN | 119654980 A | 3/2025 |
| DE | 112016003966 T5 | 6/2018 |
| DE | 112023002726 T5 | 4/2025 |
| JP | 4940533 B2 | 5/2012 |
| JP | 5487625 B2 | 5/2014 |
| KR | 20220060974 A | 5/2022 |
| WO | 2024/032536 A1 | 2/2024 |

* cited by examiner

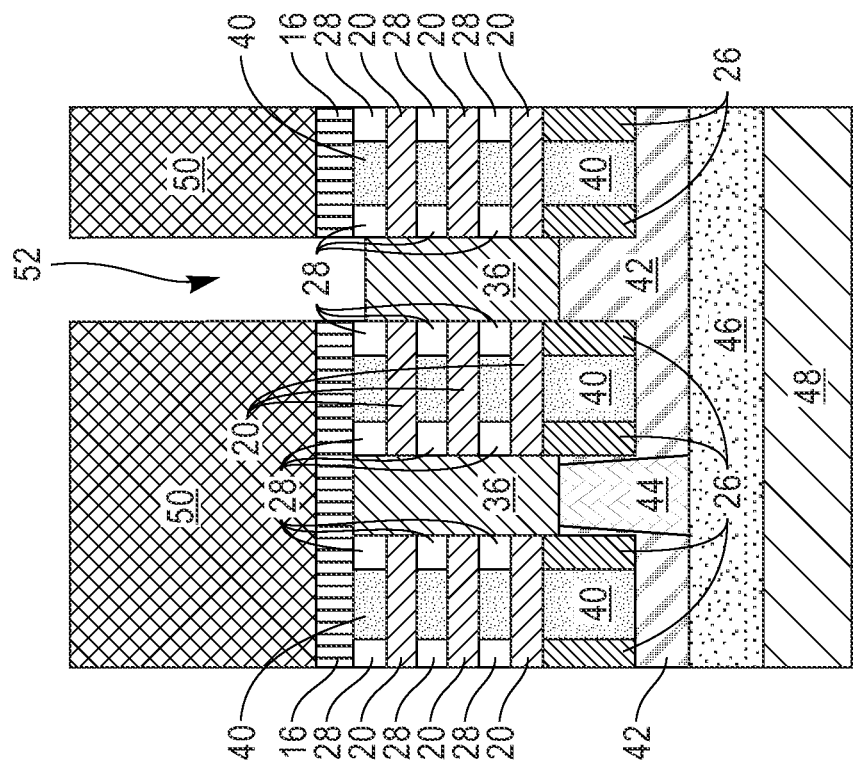
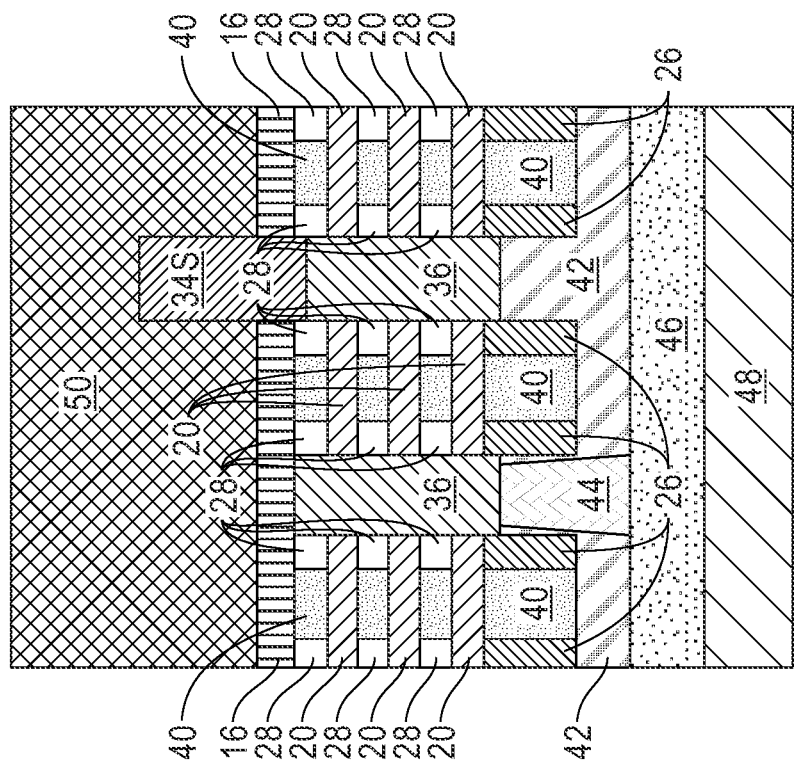
FIG. 11A
FIG. 11B

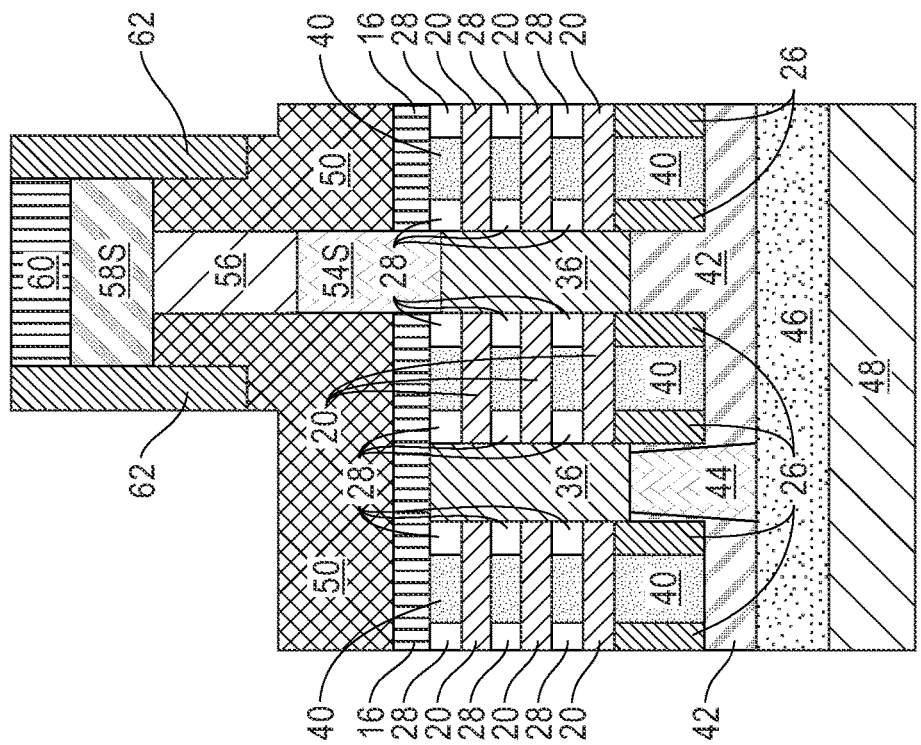
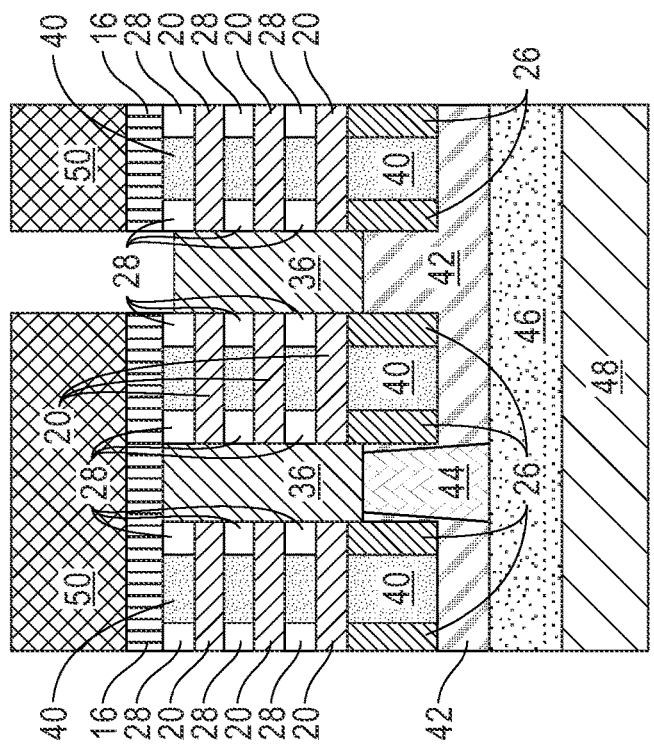
FIG. 18A
FIG. 18B

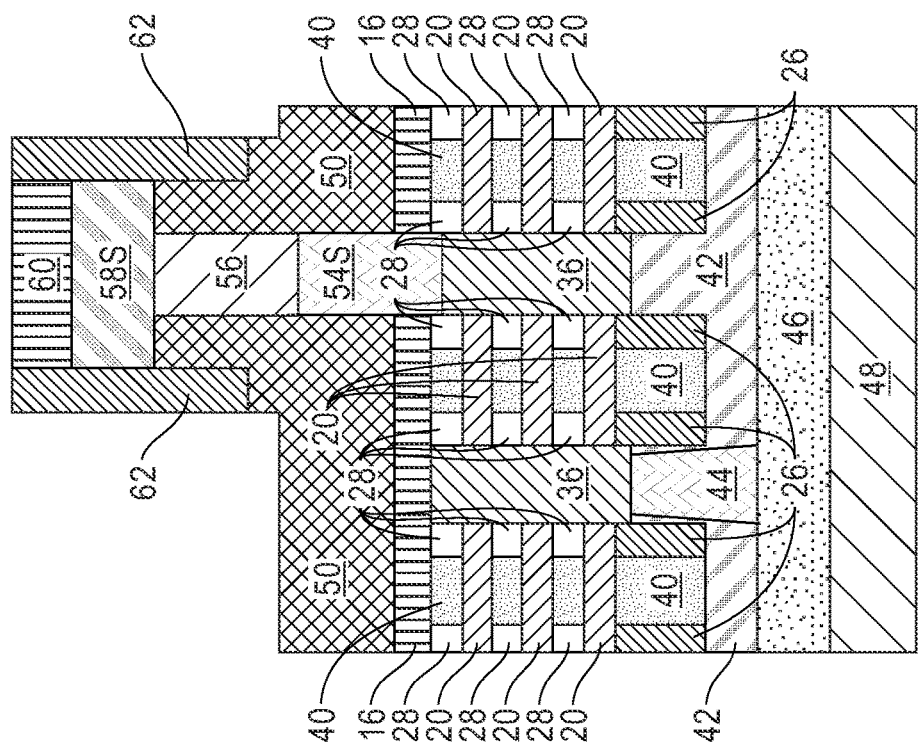
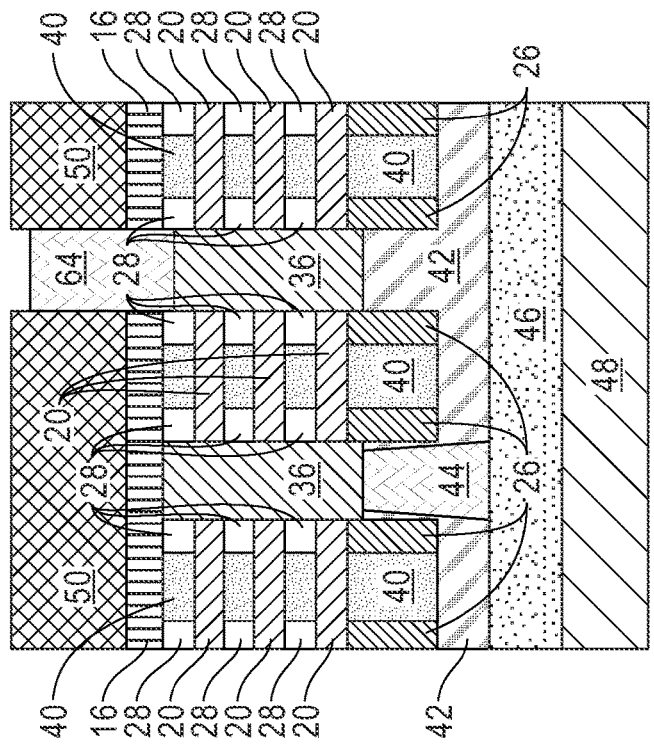
FIG. 19A
FIG. 19B

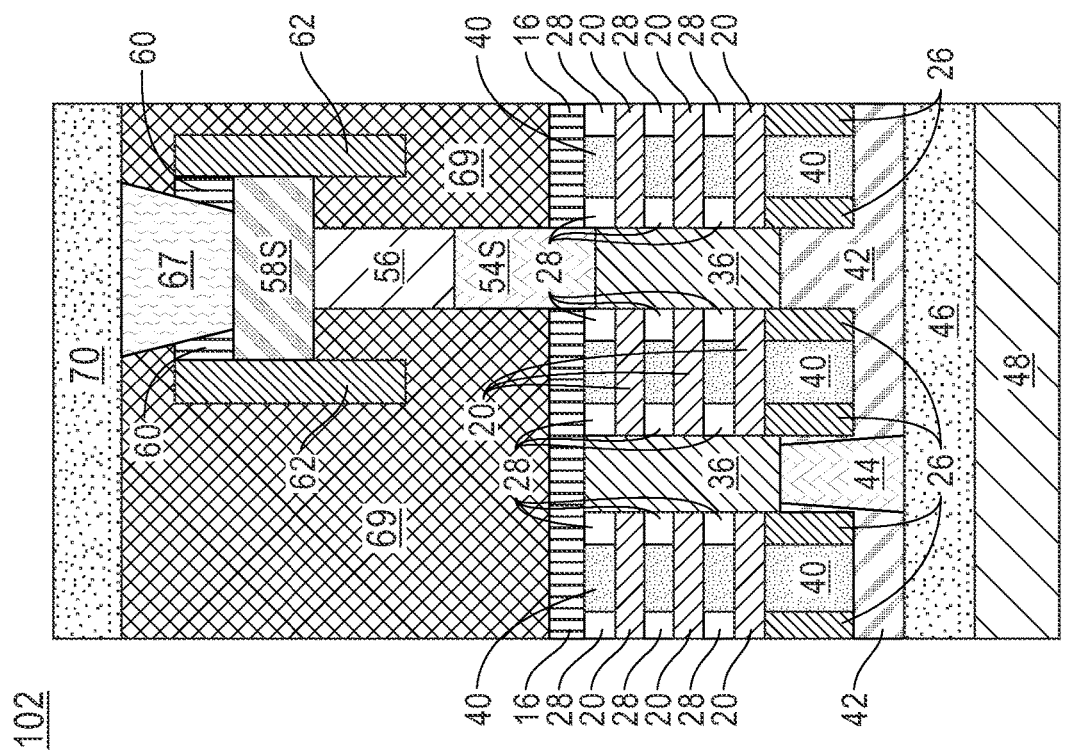
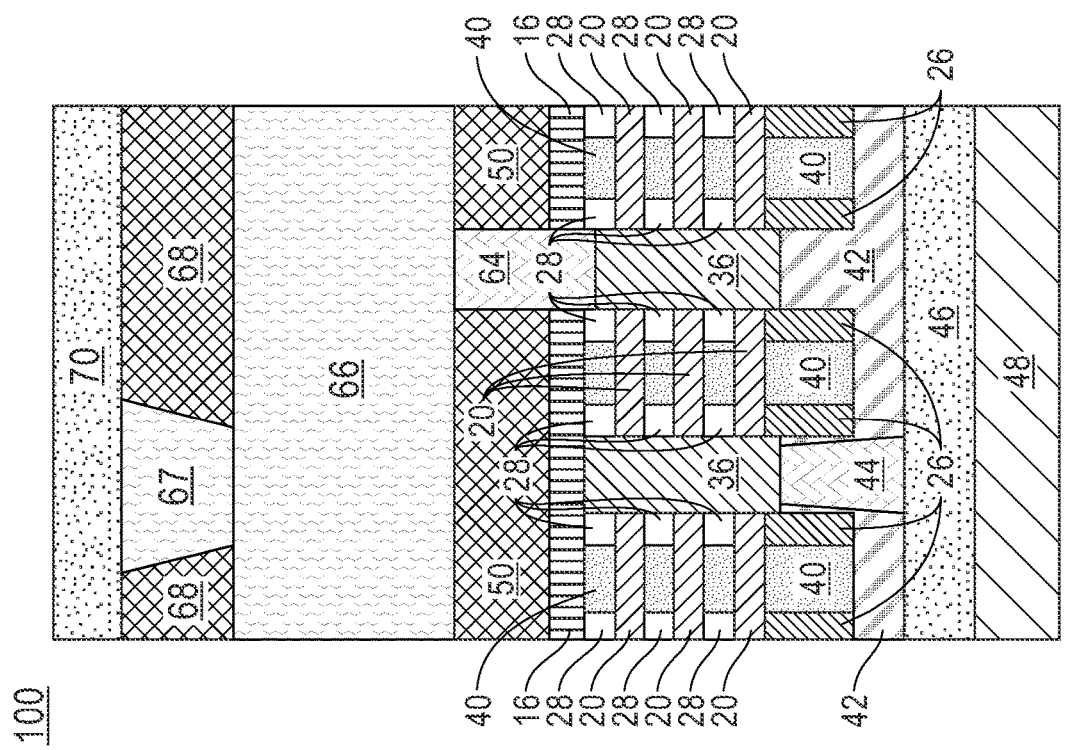
FIG. 20A
FIG. 20B

MRAM INTEGRATION WITH SELF-ALIGNED DIRECT BACK SIDE CONTACT

BACKGROUND

The present application relates to semiconductor technology, and more particularly to a semiconductor structure containing a magnetoresistive random access memory (MRAM) in the back side of a wafer and a method of forming the same.

MRAM is a viable memory option for stand-alone and embedded applications such as, for example, internet of things (IoT), automobile, or artificial intelligence (AI). MRAM is a non-volatile random access memory technology in which data is stored by magnetic storage elements. These elements are typically formed from two ferromagnetic plates, each of which can hold a magnetization, separated by a thin dielectric layer, i.e., the tunnel barrier layer. One of the two plates is a permanent magnetic set to a particular polarity; the other plate's magnetization can be changed to match that of an external field to store memory. MRAMs are typically formed in a back-end-of-the-line (BEOL) region of a semiconductor structure and thus there is a great distance between the source/drains regions of a field effect transistor (FET) and the MRAMs.

SUMMARY

A back side contact structure is provided that directly connects a first electrode of a MRAM, which is present in a back side of a wafer, to a source/drain structure of a transistor. The back side contact is self-aligned to the source/drain structure of the transistor as well as to the first electrode of the MRAM. The close proximity between the MRAM and the source/drain structure increases the speed of the device. MRAM yield is not compromised since no re-sputtering of back side contact metal onto the MRAM occurs.

In one aspect of the present application, a semiconductor structure is provided. In one embodiment, the semiconductor structure includes a MRAM located in a MRAM device region and in a back side of a wafer. The MRAM includes a first electrode, a MRAM stack, and a second electrode. A first back side source/drain contact structure is present that directly connects the first electrode of the MRAM to a first source/drain structure of a first transistor that is present in a front side of the wafer and in the MRAM device region.

In some embodiments of the present application, the first back side source/drain contact structure has an outermost sidewall that is substantially vertically aligned to an outermost sidewall of the first electrode. The term "substantially" when used with the phrase "vertically aligned" denotes that an outmost sidewall of one structure is within ±5.0 percent of an outmost sidewall of another structure; in some instances perfect vertical alignment is obtained. In some embodiments of the present application, the outermost sidewall of the first back side source/drain contact structure is substantially vertically aligned to the outermost sidewall of the first source/drain structure of the first transistor. Such "vertical alignment" provides reduced overlay error in the device.

In some embodiments of the present application, the first transistor includes a vertical stack of semiconductor channel material nanosheets, and a functional gate structure that wraps around each of the semiconductor channel material nanosheets. Such a transistor can be referred to a nanosheet field effect transistor. In other embodiments, the first transistor is a planar transistor, a finFET transistor, or a nanowire transistor.

In some embodiments of the present application, the structure further includes a bottom dielectric isolation layer located on a surface of the first transistor, the bottom dielectric isolation layer having a sidewall in direct physical contact with an outermost sidewall of the first back side source/drain contact structure.

In some embodiments of the present application particularly when a nanosheet field effect transistor is employed as the first transistor, an inner spacer is located laterally adjacent to the functional gate structure of the transistor.

In some embodiments of the present application, the structure further includes a second source/drain structure located on a second side of a functional gate structure of the first transistor opposite a first side of the functional gate structure of the first transistor. In such embodiments, the structure can further include a first front side source/drain contact structure connecting the second source/drain structure of the first transistor to a front side back-end-of-the-line (BEOL) structure. In embodiments of the present application, a carrier wafer is located on a surface of the front side BEOL structure.

In some embodiments of the present application, the structure also include a MRAM spacer located laterally adjacent to, and in direct physical contact with, the MRAM stack and the second electrode, wherein the MRAM spacer is located laterally adjacent to, but spaced apart from the first electrode. In such embodiments, the MRAM spacer has a bottommost surface that is located between a bottommost surface and a topmost surface of the first electrode.

In some embodiments of the present application, a back side interlayer dielectric (ILD) material layer stack laterally surrounds the MRAM and an upper portion of the first back side source/drain contact structure.

In some embodiments of the present application, the second electrode is in electrical contact with a back side interconnect structure. In such embodiments, the structure further includes a contact via structure that vertically extends through the second electrode, the contact via structure having a first surface in direct contact with the MRAM stack, and a second surface, opposite the first surface, which is in direct contact with the back side interconnect structure.

In some embodiments of the present application, the structure further includes a second transistor located in a front side of the wafer and in a logic device region that is positioned adjacent to the MRAM device region, wherein the second transistor has a first source/drain structure located on a first side of a functional gate structure of the second transistor, and a second source/drain structure located on a second side of the functional gate structure of the second transistor opposite the first side of the functional gate structure of the second transistor.

In some embodiments of the present application, a second back side source/drain contact structure is located in the logic device region and connecting the first source/drain structure of the second transistor to a back side power rail. In some embodiments of the present application, the back side power rail is in electrical contact with a back side interconnect structure. In embodiments, a via contact structure is located between the back side interconnect structure and the back side power rail.

In some embodiments of the present application, the structure further includes a front side source/drain contact structure located in the logic device region connecting the second source/drain structure of the second transistor to a front side BEOL structure. In some embodiments of the present application, a carrier wafer is located on a surface of the front side BEOL structure.

In some embodiments of the present application, the second back side source/drain contact structure that is present in the logic device region has a topmost surface that is located beneath a bottommost surface of a MRAM spacer that surrounds the MRAM device.

In another embodiment of the present application, the semiconductor structure includes a MRAM device region including a MRAM comprising a first electrode, a MRAM stack, and a second electrode, and located in a back side of a wafer. The MRAM device region also includes a first transistor having a first source/drain structure, and a first back side source/drain contact structure directly connecting the first electrode of the MRAM to a first source/drain structure of a first transistor. In the present application, the first back side source/drain contact structure has an outermost sidewall that is substantially vertically aligned to an outermost sidewall of both the first source/drain structure of the first transistor and the first electrode. The structure further includes a logic device region located adjacent to the MRAM device region, wherein the logic device region includes a second transistor located in a front side of the wafer and having a first source/drain structure located on a first side of a functional gate structure of the second transistor, and a second back side source/drain contact structure directly connecting the first source/drain structure of the functional gate structure of the second transistor to a back side power rail.

In some embodiments, the second back side source/drain contact structure has a topmost surface that is located beneath a bottommost surface of a MRAM spacer that surrounds the MRAM device.

In some embodiments, the MRAM spacer has a bottommost surface that is located between a bottommost surface and a topmost surface of the first electrode.

In some embodiments, the back side power rail is in electrical contact with a back side interconnect structure that is located on top of the back side power rail, and the second electrode of the MRAM is in electrical contact with the back side interconnect structure that is located on top of the MRAM.

In another aspect of the present application, a method of forming a semiconductor structure is provided. The method of the present application will become more apparent by referring to the drawings and the detailed description that follows.

BRIEF DESCRIPTION OF THE DRAWINGS

FIGS. 11A and 11B are cross sectional views of the exemplary structure shown in FIGS. 10A and 10B, respectively, after removing the MRAM device region sacrificial placeholder material structure in the MRAM device region to provide an opening that physically exposes a surface of the source/drain structure present in the MRAM device region.

FIGS. 18A and 18B are cross sectional views of the exemplary structure shown in FIGS. 17A and 17B, respectively, after removing the logic device region sacrificial placeholder material structure in the logic device region to reveal the source/drain structure present in the logic device region.

FIGS. 19A and 19B are cross sectional views of the exemplary structure shown in FIGS. 18A and 18B, respectively, after forming a logic device back side source/drain contact on the revealed source/drain structure in the logic device region.

FIGS. 20A and 20B are cross sectional views of the exemplary structure shown in FIGS. 19A and 19B, respectively, after forming a back side power rail in the logic device region, a second back side ILD material layer in both the logic device region and the MRAM device region, a contact via structure in both the logic device region and the MRAM device region, and a back side interconnect structure in both the logic device region and the MRAM device region.

DETAILED DESCRIPTION

Figure 1A:
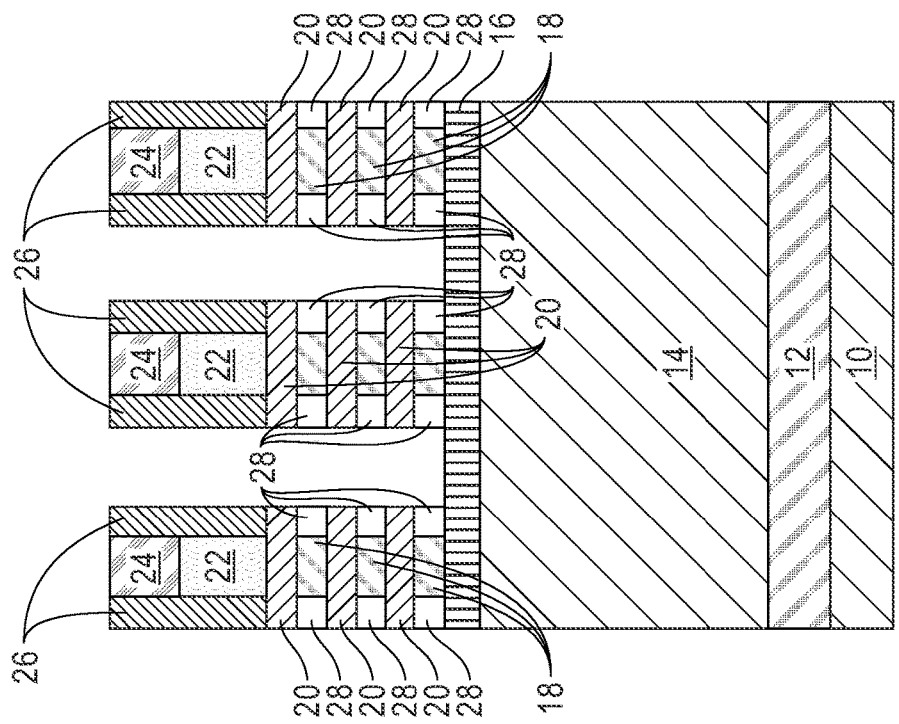
FIGS. 1A and 1B are cross sectional views of an exemplary structure in a logic device region, and a MRAM device region, respectively, the exemplary structure including at least one nanosheet-containing stack located on a semiconductor substrate that includes a first semiconductor material layer, an etch stop layer, a second semiconductor material layer, a sacrificial gate structure located on the at least one nanosheet-containing stack, and a hard mask cap located on the sacrificial gate structure, wherein the at least one nanosheet-containing stack contains alternating recessed sacrificial semiconductor material nanosheets and semiconductor channel material nanosheets.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
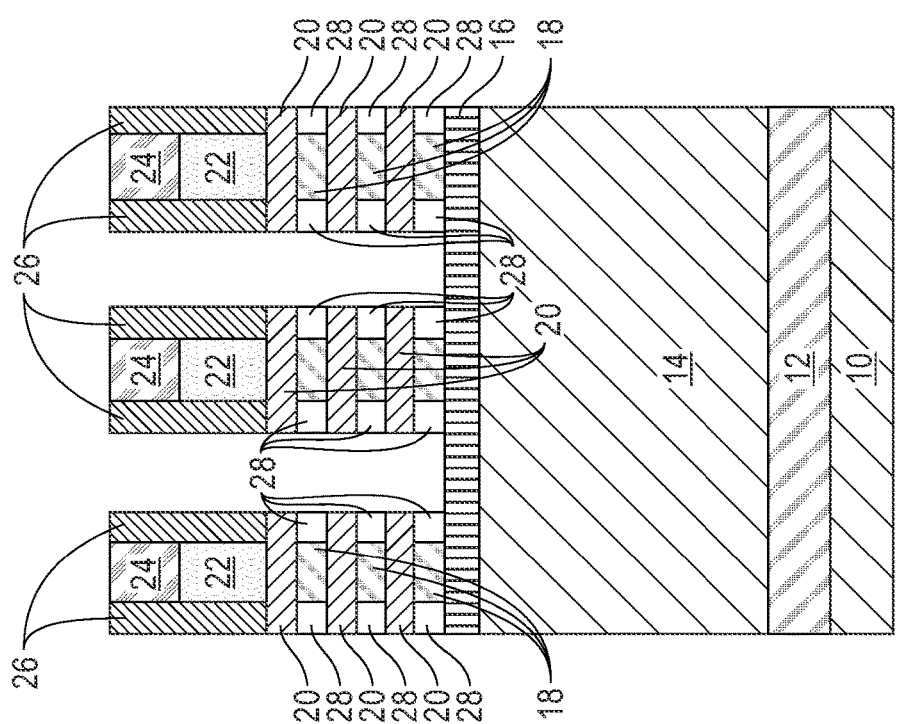

Referring first to FIGS. 1A and 1B, there are illustrated an exemplary structure in a logic device region 100, and a MRAM device region 102, respectively. The logic device region 100 and the MRAM device region 102 are located adjacent to each other and are present at a same level in the exemplary structure. The exemplary structure shown in FIGS. 1A and 1B includes at least one nanosheet-containing stack located on a semiconductor substrate. The number of nanosheet-containing stacks that are present in both the logic device region 100 and the MRAM device region 102 may vary and is not limited to three nanosheet-containing stacks in each of those device regions. Also, the number of nanosheet-containing stacks in the logic device region 100 can be equal to, greater than, or less than, the number of nanosheet-containing stacks that are present in the MRAM device region 102. Although the present application describes and illustrates a logic device area 100, the present application contemplates embodiments in which an analog device region replaces or is used in conjunction with the logic device region 100. Also, although the present application describes the formation of nanosheet field effect transistors (FETs) in both device regions, the present application contemplates embodiments in which the nanosheets FETs are replaced with other types of FETs including, but not limited to, planar FETs, finFETs or semiconductor nanowire FETs.

The semiconductor substrate that is present in both the logic device region 100 and the MRAM device region 102 includes a first semiconductor material layer 10, an etch stop layer 12, and a second semiconductor material layer 14. Also present is a sacrificial gate structure 22 located on the at least one nanosheet-containing stack, and a hard mask cap 24 is located on the sacrificial gate structure 22. The at least one nanosheet-containing stack contains alternating recessed sacrificial semiconductor material nanosheets 18 and semiconductor channel material nanosheets 20. The exemplary structure illustrated in FIGS. 1A and 1B further includes a bottom dielectric isolation layer 16 located between the second semiconductor material layer 14 of the semiconductor substrate and the at least one nanosheet-containing stack in both the logic device region 100 and the MRAM device region 102. Also, a dielectric spacer 26 is located laterally adjacent to the sacrificial gate structure 22 and the hard mask cap 24 and on top of the at least one nanosheet-containing stack, and an inner spacer 28 is located laterally adjacent to each recessed sacrificial semiconductor material nanosheet 20. The inner spacer 28 has a first sidewall that is direct physical contact with a sidewall of the laterally adjacent recessed sacrificial semiconductor material nanosheet 18, and a second sidewall opposite the first sidewall, the is substantially vertically aligned to an outermost sidewall of each semiconductor channel material nanosheet 20 and an outermost sidewall of the dielectric spacer 26.

The first semiconductor material layer 10 of the semiconductor substrate is composed of a first semiconductor material having semiconducting properties. Examples of first semiconductor materials that can be used to provide the first semiconductor material layer 10 include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material layer 14 is composed of a second semiconductor material. The second semiconductor material that provides the second semiconductor material layer 14 can be compositionally the same as, or compositionally different from the first semiconductor material that provides the first semiconductor material layer 10. In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the semiconductor material that provides both the first semiconductor material layer 10 and the second semiconductor material layer 14.

In one example, the first semiconductor material layer 10 is composed of silicon, the etch stop layer 12 is composed of silicon dioxide, and the second semiconductor material layer 14 is composed of silicon. Such a semiconductor substrate including silicon/silicon dioxide/silicon can be referred to as a silicon-on-insulator (all) substrate. In another example, the first semiconductor material layer 10 is composed of silicon, the etch stop layer 12 is composed of silicon germanium, and the second semiconductor material layer 14 is composed of silicon. Such a semiconductor substrate including silicon/silicon germanium/silicon can be referred to as a bulk semiconductor substrate.

As mentioned above, the at least one nanosheet-containing stack includes alternating recessed sacrificial semiconductor material nanosheets 18 and semiconductor channel material nanosheets 20. The at least one nanosheet-containing stack includes 'n' semiconductor channel material nanosheets 20 and "n or n+1" recessed sacrificial semiconductor material nanosheets 18; the "n+1" embodiment is not shown. In the illustrated embodiment, the at least one nanosheet-containing stack includes "n" recessed sacrificial semiconductor material nanosheets 18 and "n" semiconductor channel material nanosheets 20. By way of one example, the at least one nanosheet-containing stack includes three semiconductor channel material nanosheets 20 and three recessed sacrificial semiconductor material nanosheets 18.

Each recessed sacrificial semiconductor material nanosheet 18 is composed of a third semiconductor material, while each semiconductor channel material nanosheet 20 is composed of a fourth semiconductor material that is compositionally different from the third semiconductor material. In some embodiments, the semiconductor channel material nanosheets 20 are composed of a fourth semiconductor material capable of providing high channel mobility for NFET devices. In other embodiments, the semiconductor channel material nanosheets 20 are composed of a fourth semiconductor material capable of providing high channel mobility for PFET devices.

The third semiconductor material that provides each recessed sacrificial semiconductor material nanosheet 18 and the fourth semiconductor material that provides each semiconductor channel material nanosheets 20 can include one of the semiconductor materials mentioned above for the first semiconductor material layer 10. In one example, the third semiconductor material that provides each recessed sacrificial semiconductor material nanosheet 18 is composed of a silicon germanium alloy, while the fourth semiconductor material that provides each semiconductor channel material nanosheet 20 is composed of silicon.

Each recessed sacrificial semiconductor material nanosheet 18 has a first width and each semiconductor channel material nanosheets 20 has a second width that is greater than the first width. In one example, the first width is from 10 nm to 100 nm, and the second width is from 20 nm to 130 nm. Each recessed sacrificial semiconductor material nanosheet 18 and each semiconductor channel material nanosheets 20 have a same length. In one example, the length of each recessed sacrificial semiconductor material nanosheet 18 and each semiconductor channel material nanosheets 20 is from 10 nm to 130 nm. The vertical height of each recessed sacrificial semiconductor material nanosheet 18 and each semiconductor channel material nanosheets 20 is within a range from 4 nm to 20 nm. The vertical height of each recessed sacrificial semiconductor material nanosheet 18 can be equal to, greater than, or less than, the vertical height of each semiconductor channel material nanosheets 20.

The sacrificial gate structure 22 includes at least a sacrificial gate material. In some embodiments, the sacrificial gate structure 22 can include a sacrificial gate dielectric material. The sacrificial gate dielectric material can be composed of a dielectric material such as, for example, silicon dioxide. The sacrificial gate material can include, but is not limited to, polysilicon, amorphous silicon, amorphous silicon germanium, tungsten, titanium, tantalum, aluminum, nickel, ruthenium, palladium, platinum, or alloys of such metals.

The hard mask cap 24 can be composed of a hard mask material such as, for example, silicon dioxide, silicon nitride, silicon oxynitride or any multilayered combination thereof. The hard mask cap 24 can also be omitted in some embodiments.

The dielectric spacer 26 is composed of a gate spacer dielectric material. Examples of gate spacer dielectric materials that can be used in providing the dielectric spacer 26 include, but are not limited to, SiN, SiBCN, SiOCN or SiOC.

The bottom dielectric isolation layer 16 is composed of one of the gate spacer dielectric materials mentioned above for dielectric spacer 26. The bottom dielectric isolation layer 16 and dielectric spacer 26 are formed at the same time, thus they are composed of a compositionally same gate spacer dielectric material. The bottom dielectric isolation layer 16 can have a thickness from 5 nm to 50 nm; although other thicknesses for the bottom dielectric isolation layer 16 are contemplated and can be employed as the thickness of the bottom dielectric isolation layer 16.

The inner spacer 28 is composed one of the gate spacer dielectric materials mentioned above for dielectric spacer 26. The gate spacer dielectric material that provides the inner spacer 28 can be compositionally the same as, or compositionally different from, the gate dielectric spacer material that provides the dielectric spacer 26.

The exemplary structure shown in FIGS. 1A and 1B can be formed utilizing conventional nanosheet stack forming processes that are well known to those skilled in the art. In one example, the exemplary structure shown in FIGS. 1A and 1B can be formed by first forming a sacrificial placeholder material layer (not shown) on a surface of the second semiconductor material layer 14 of a semiconductor substrate, the substrate also includes etch stop layer 12 and first semiconductor material layer 10. The sacrificial placeholder material layer can include a semiconductor material that is compositionally different from the second semiconductor material that provides the second semiconductor material layer 14, the third semiconductor material that provides each recessed sacrificial semiconductor material nanosheet 18, and the fourth semiconductor material that provides each semiconductor channel material nanosheet 20. The forming of the placeholder material layer can include an epitaxial growth process or any other deposition process such as, for example, chemical vapor deposition (CVD), plasma enhanced chemical vapor deposition (PECVD), physical vapor deposition (PVD) atomic layer deposition (ALD) or evaporation. After forming the placeholder material layer, a material stack of alternating layers of the third and fourth semiconductor material layers are formed by epitaxial growth or one of the deposition processes mentioned above for forming the placeholder material. Lithography and etching can then be used to pattern the material stack and the placeholder material layer into a multilayered material structure that includes a remaining portion of the placeholder material layer and a remaining portion of the material stack.

The terms "epitaxial growth" or "epitaxially growing" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

Sacrificial gate structure 22 and hard mask cap 24 are then formed on this multilayered material by depositing blanket layers of a sacrificial gate dielectric material (if the same is present), a sacrificial gate material and a dielectric hard mask material. The depositing of the blanket layers of the dielectric hard mask material, sacrificial gate material, and, if present, sacrificial gate dielectric material includes, but is not limited to, CVD, PECVD, PVD, ALD or any combination of such deposition processes. After forming these blanket layers, a patterning process (including lithography and etching) is used to convert the blanket layer of hard mask material into a hard mask cap 24 and the blanket layers of the sacrificial gate dielectric material (if present) and the sacrificial gate dielectric material into the sacrificial gate structure 22. The etch can include dry etching and/or wet chemical etching. Dry etching can include a reactive ion etch (RIE), a plasma etch or an ion beam etch (IBE). A plurality of such sacrificial gate structures 22 capped with hard mask cap 24 can be formed in each of the logic device region 100 and the MRAM device region 102.

Next, the placeholder material layer that is present in the multilayered material stack is removed utilizing an etching process that is selective in removing the placeholder material layer. A space (or gap) is formed between a bottommost sacrificial semiconductor material layer of the multilayered material stack and the second semiconductor material layer 14. The structure is not free floating, but is held in place by the sacrificial gate structure 22. Next, dielectric spacer 26 and the bottom dielectric isolation layer 16 are formed simultaneously. Notably, the dielectric spacer 26 and the bottom dielectric isolation layer 16 are formed by deposition of a gate dielectric spacer material, followed by a spacer etch. The deposition fills in the gap and forms the bottom dielectric isolation layer 16. In embodiments, the dielectric spacer 26 can be I-shaped, and have a topmost surface that is coplanar with a topmost surface of the hard mask cap 24.

After forming the dielectric spacer 22 and the bottom dielectric isolation layer 16, the multilayered material stack including alternating layers of the third and fourth semiconductor materials is etched in which the hard mask cap 24/gate structure 22 and the dielectric spacer 26 serve as an etch mask. The etch stops on the bottom dielectric isolation layer 16, In the present application, the non-etched (i.e., remaining) portion of each sacrificial semiconductor material layer is referred to as a sacrificial semiconductor material nanosheet, and the non-etched (i.e., remaining) portion of each semiconductor channel material layer is referred to as a semiconductor channel material nanosheet 20, Next, inner spacer 28 are formed. The inner spacers 28 are formed by first recessing each of the sacrificial semiconductor material nanosheets to form an inner spacer gap adjacent to the ends of each recessed sacrificial semiconductor material nanosheet 18. After this recessing step, the remaining (i.e., recessed) sacrificial semiconductor material nanosheets 18 have a reduced lateral width as compared to the width of the original sacrificial semiconductor material nanosheets. The recessing includes a lateral etching process that is selective in removing the sacrificial semiconductor material nanosheets relative to the semiconductor channel material nanosheets 20. Next, inner spacers 28 are formed in the inner spacer gap by conformal deposition of a spacer dielectric material, followed by isotropic etching.

Figure 2B:
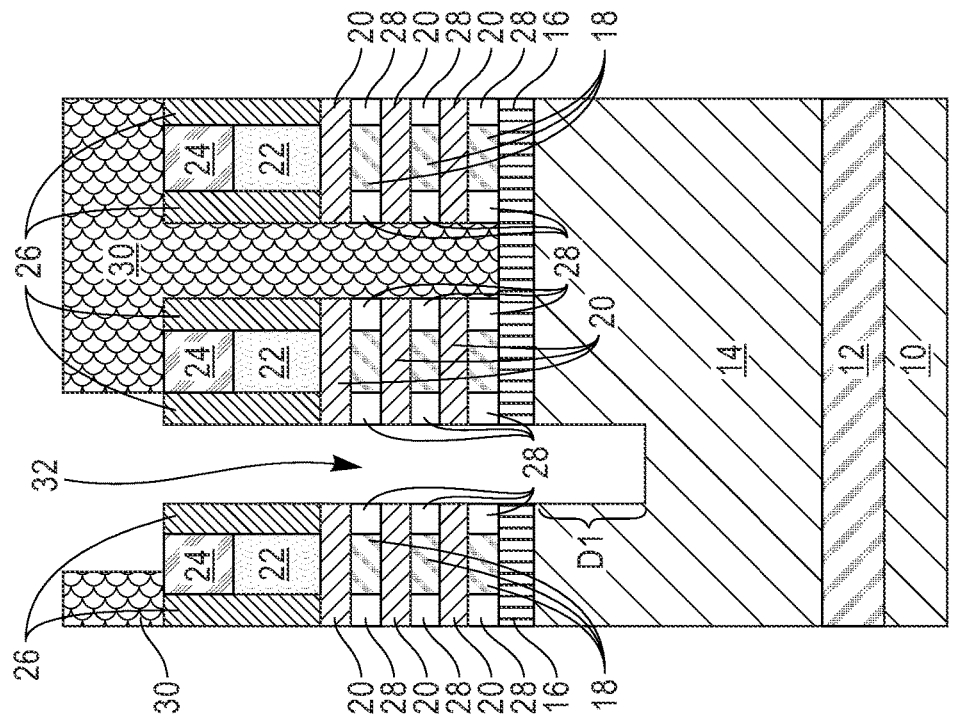
FIGS. 2A and 2B are cross sectional views of the exemplary structure shown in FIGS. 1A and 1B, respectively, after forming an opening into the semiconductor substrate in both the logic device region and the MRAM device region.
Figure 2A:
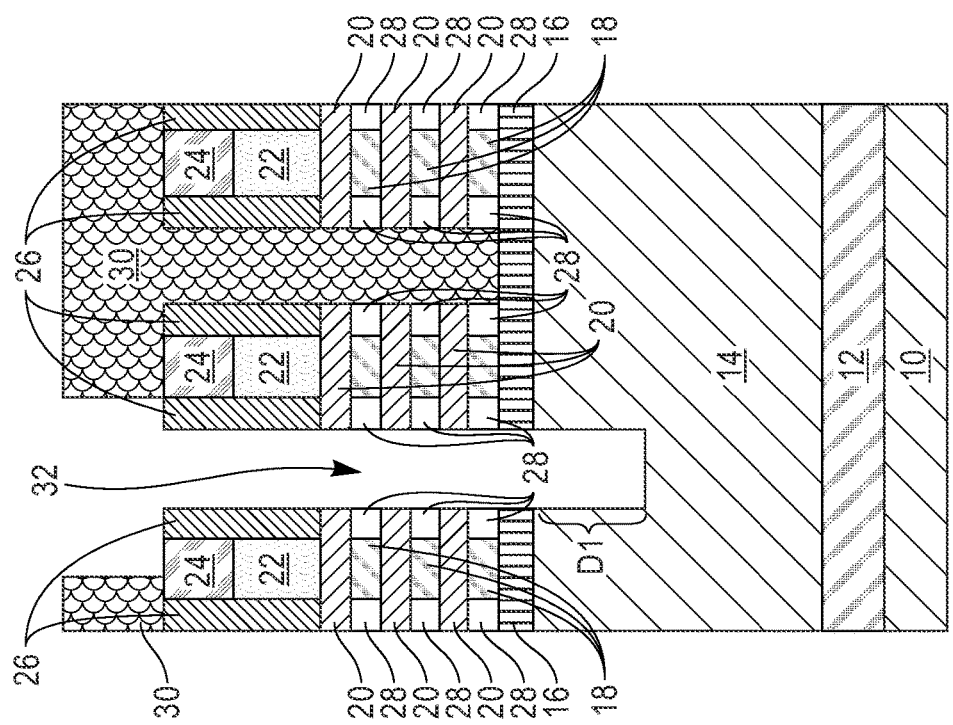

Referring now to FIGS. 2A and 2B, there are illustrated the exemplary structure shown in FIGS. 1A and 1B, respectively, after forming an opening 32 into the semiconductor substrate in both the logic device region 100 and the MRAM device region 102. The opening 32 that is formed in both the logic device region 100 and the MRAM device region 102 can be formed by lithography and etching. The lithographic step can include forming a patterned masking layer 30 having opening therein that physically expose a surface of the bottom dielectric isolation layer 16 in an area the is located between two adjacent stacks of nanosheets as is shown in FIGS. 2A and 2B. The patterned masking layer 30 can include an organic planarization layer (OPL). The etching, which can include dry etching and/or chemical etching. removes physically exposed portions of the dielectric isolation layer 16 and stops within a sub-surface of the second dielectric material layer 14. The term "sub-surface" denotes a surface of a structure that is located between a topmost surface and a bottommost surface of the same structure. At this point of the present application, the openings 32 that are formed in each of the logic device region 100 and the MRAM device region 102 extend a first depth, D1, below the topmost surface of the second dielectric material layer 14. After forming the openings 32 having the first depth, D1, the patterned masking layer 30 is removed from the structure utilizing one or more material removal processes.

Figure 3B:
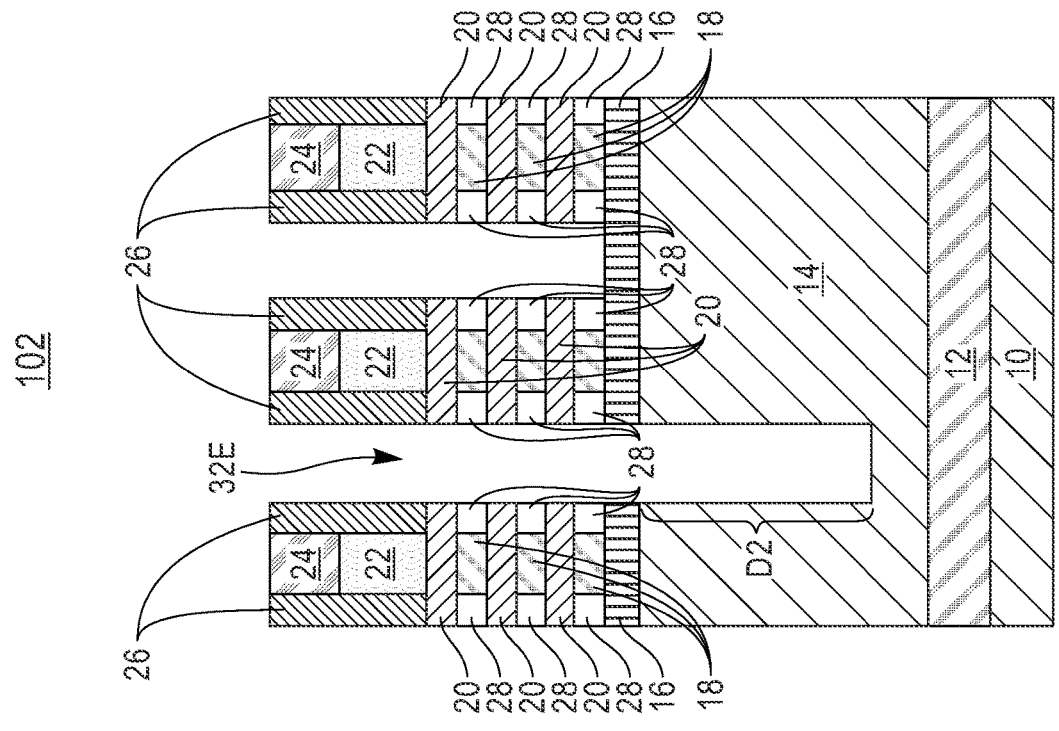
FIGS. 3A and 3B are cross sectional views of the exemplary structure shown in FIGS. 2A and 2B, respectively, after forming a block mask in the logic device region, but not the MRAM device region, and extending a depth of the opening in the MRAM device region.
Figure 3A:
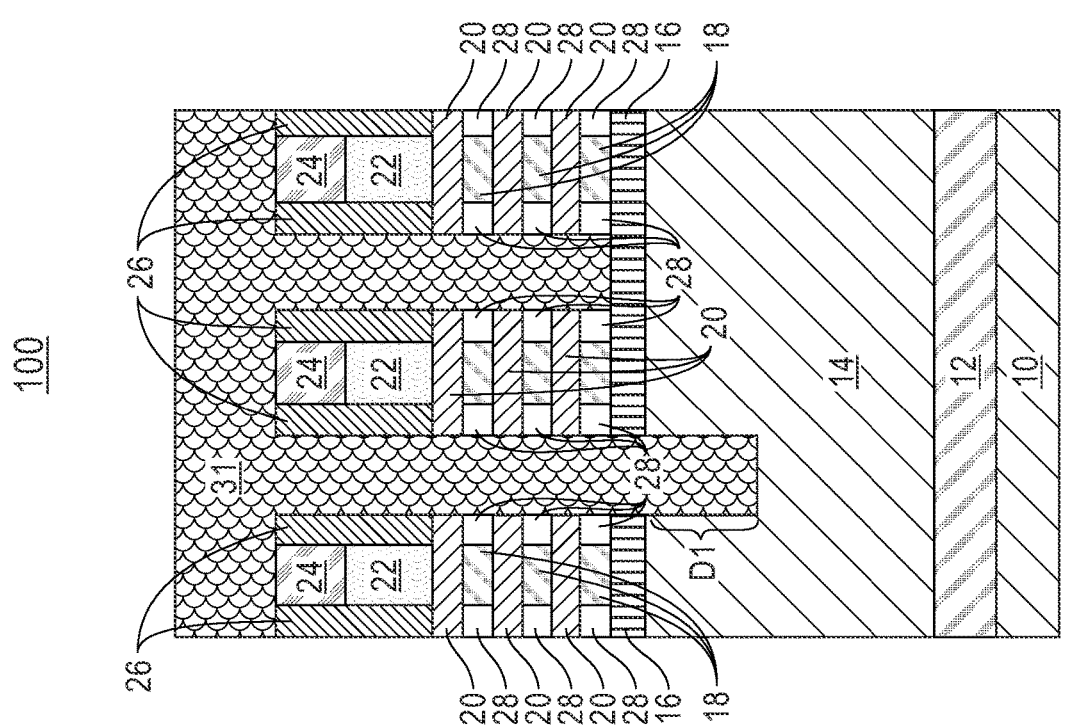

Referring now to FIGS. 3A and 3B, there are illustrated the exemplary structure shown in FIGS. 2A and 2B, respectively, after forming a block mask 31 in the logic device region 100, but not the MRAM device region 102, and extending a depth of the opening 32 in the MRAM device region 102. The extending the depth of the opening 32 in the MRAM device region 102 provides an extended depth opening 32E in that MRAM device region 102. Block mask 31 can include an OPL that is formed by deposition and lithographic patterning. The extending the depth of the opening 32 in the MRAM device region 102 includes an etching process as mentioned above in forming the opening 32. The extended depth opening 32E extends a second depth, D2, below the topmost surface of the second dielectric material layer 14 in the MRAM device region 102. In present application, D2 is greater than D1. In one example, D2 is about 90 nm, while D1 is about 50 nm; here the term "about" denotes ±10 percent of the numerical value.

Figures 4A, 4B:
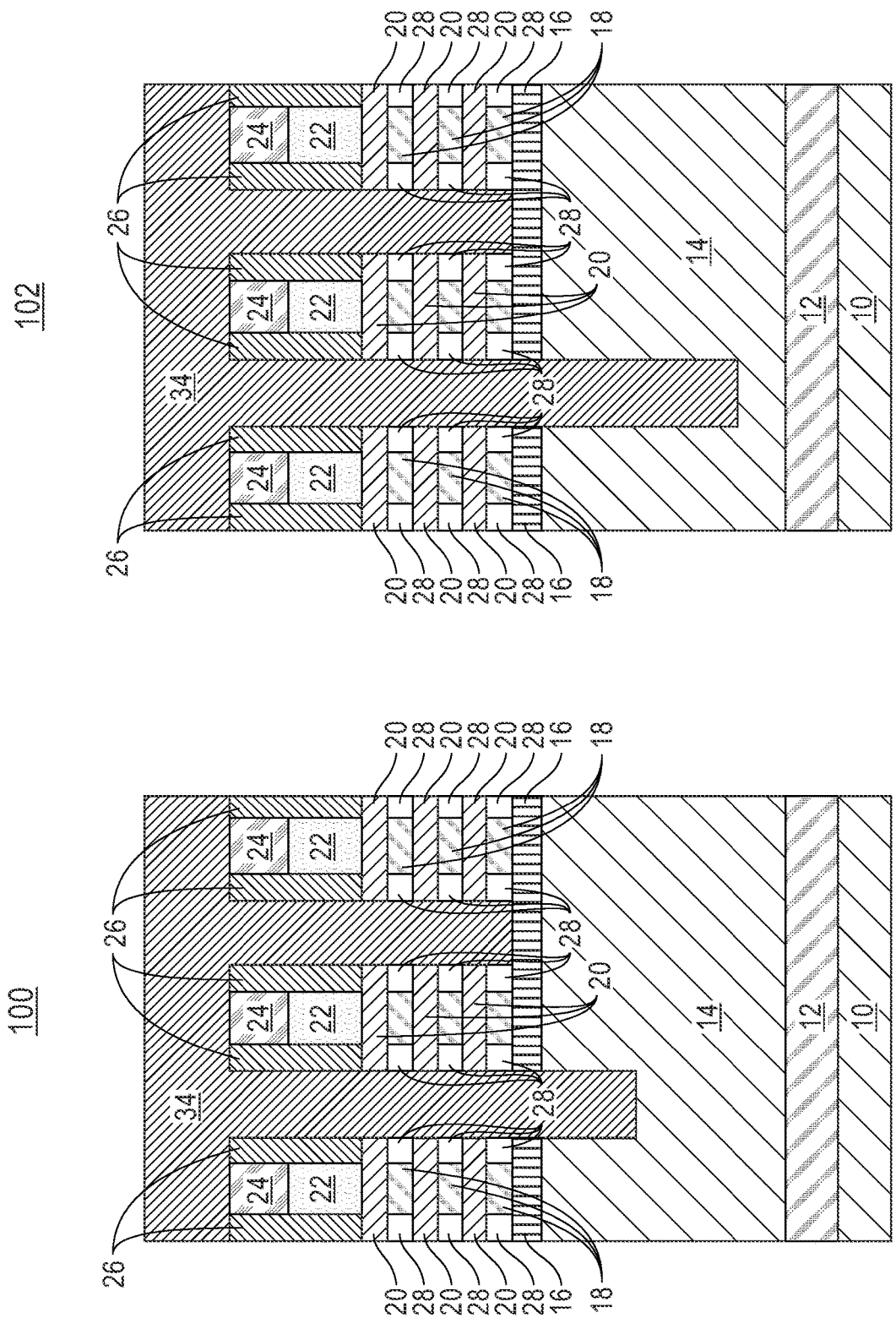
FIGS. 4A and 4B are cross sectional views of the exemplary structure shown in FIGS. 3A and 3B, respectively, after removing the block mask, and forming a sacrificial placeholder material in the opening in the logic device region and in the extended depth opening in the MRAM device region.

Referring now to FIGS. 4A and 4B, there are illustrated the exemplary structure shown in FIGS. 3A and 3B, respectively, after removing the block mask 31, and forming a sacrificial placeholder material 34 in the opening 32 in the logic device region 100 and in the extended depth opening 32E in the MRAM device region 102. Block mask 31 is removed from the logic device region 100 utilizing one or more material removal processes. The sacrificial placeholder material 34 includes a metal oxide such as, for example, $TiO_x$ or $AlO_x$, a metal nitride such as, for example, TiN or TaN, or a dielectric material such as, for example, SiCO or SiC or a combination of a SiN liner and $SiO_2$ fill. The sacrificial placeholder material 34 can be formed by a deposition process such as, for example, CVD, PECVD, ALD, PVD or spin-on coating. The sacrificial placeholder material 34 fills in the opening 32 in the logic device region 100 and the extended depth opening 32E in the MRAM device region 102, and is formed on top of each of the hard mask capped sacrificial gate structures that are present in both the logic device region 100 and the MRAM device region 102.

Figure 5A:
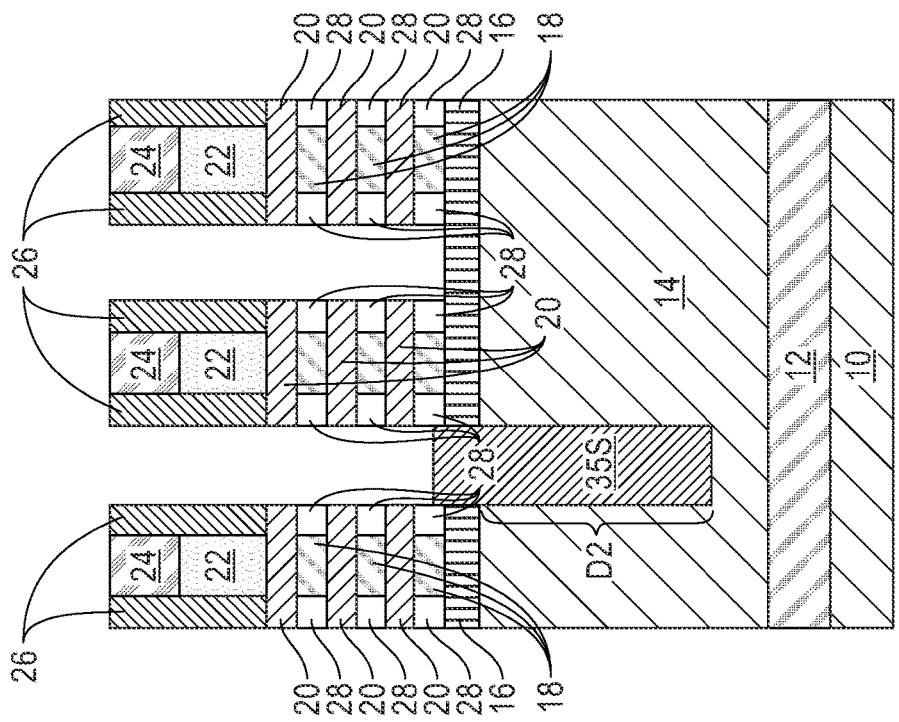
FIGS. 5A and 5B are cross sectional views of the exemplary structure shown in FIGS. 4A and 4B, respectively, after recessing the sacrificial placeholder material in both the logic device region and the MRAM device region to provide a logic device region sacrificial placeholder material structure in the logic device region and a MRAM device region sacrificial placeholder material structure in the MRAM device region.
Figure 5B:
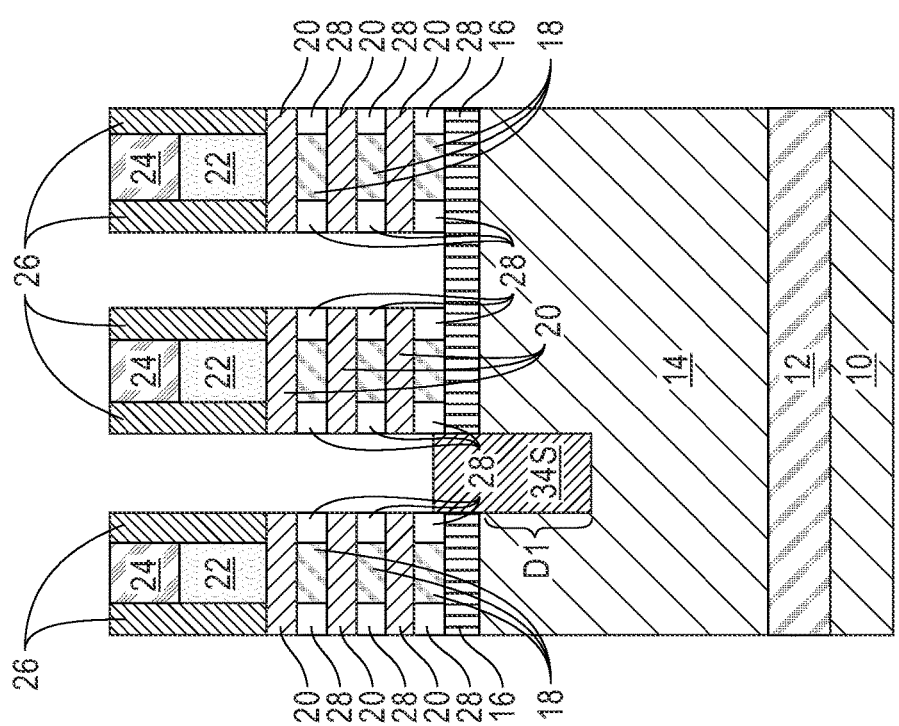

Referring now to FIGS. 5A and 5B, there are illustrated the exemplary structure shown in FIGS. 4A and 4B, respectively, after recessing the sacrificial placeholder material 34 in both the logic device region 100 and the MRAM device region 102 to provide a logic device region sacrificial placeholder material structure 34S in the logic device region 100 and a MRAM device region sacrificial placeholder material structure 35S in the MRAM device region 102. The recessing of the sacrificial placeholder material 34 in both the logic device region 100 and the MRAM device region 102 includes an etch back process that is selective in removing the sacrificial placeholder material 34. As is shown in FIG. 5B, the MRAM device region sacrificial placeholder material structure 35S extends deeper into the second semiconductor material layer 14 than the logic device region sacrificial placeholder material structure 34S. Notably, the MRAM device region sacrificial placeholder material structure 35S extends the second depth, D2, below the topmost surface of the second dielectric material layer 14 in the MRAM device region 102, while the logic device region sacrificial placeholder material structure 34S extends the first depth, D1, below the topmost surface of the second dielectric material layer 14 in the logic device region 100.

Figure 6B:
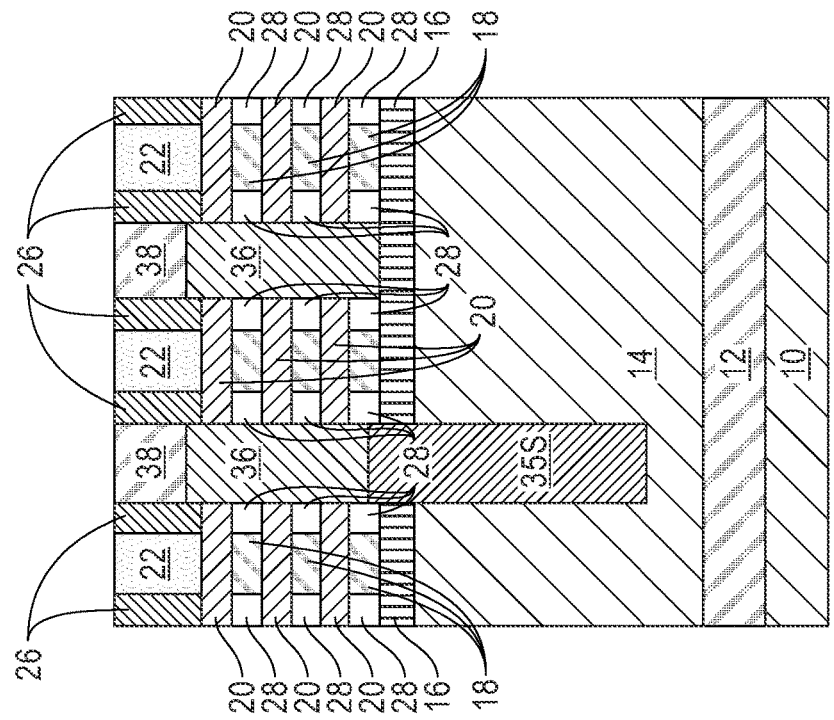
FIGS. 6A and 6B are cross sectional views of the exemplary structure shown in FIGS. 5A and 5B, respectively, after forming a source/drain structure and a first interlayer dielectric (ILD) material layer in both the logic device region and the MRAM device region.
Figure 6A:
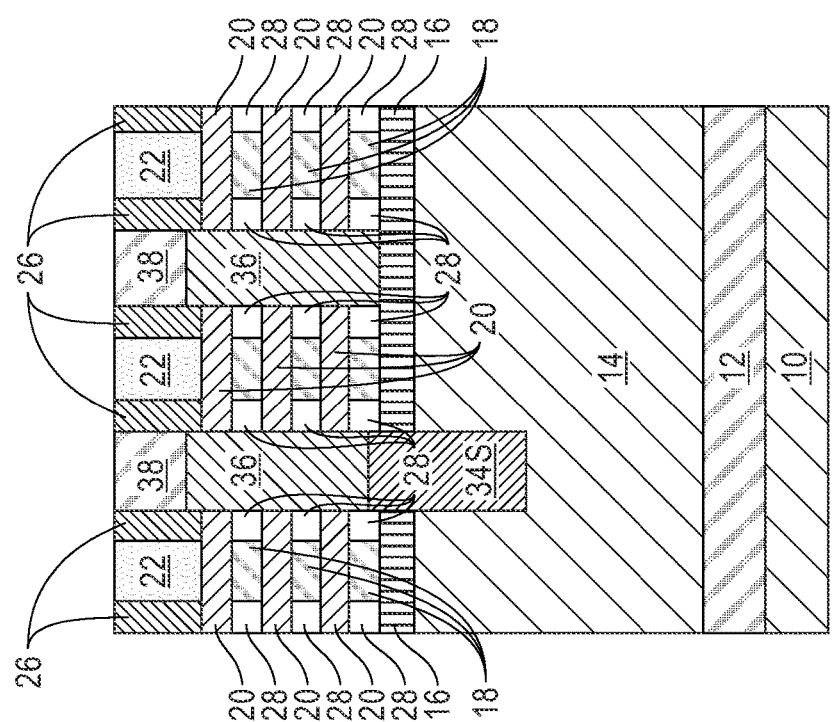

Referring now to FIGS. 6A and 6B, there are illustrated the exemplary structure shown in FIGS. 5A and 5B, respectively, after forming a source/drain structure 36 and a first interlayer dielectric (ILD) material layer 38 in both the logic device region 100 and the MRAM device region 102. As used herein, a "source/drain or S/D" structure can be a source region or a drain region depending on subsequent wiring and application of voltages during operation of the field effect transistor (FET). Each source/drain structure 36 is composed of a semiconductor material and a dopant. The semiconductor material that provides the source/drain structure 36 can include one of the semiconductor materials mentioned above for first semiconductor material layer 10. The semiconductor material that provides the source/drain structure 36 can be compositionally the same, or compositionally different from, each semiconductor channel material nanosheet 20. The semiconductor material that provides the source/drain structure 36 is however compositionally different from each recessed sacrificial semiconductor material nanosheet 18. The dopant that is present in the source/drain structure 36 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain structure 36 can have a dopant concentration of from $4\times10^{20}$ atoms/cm$^3$ to $3\times10^{21}$ atoms/cm$^3$. In one example, the bottom source/drain structure 36 is composed of phosphorus doped silicon.

The source/drain structure 36 can be formed from an epitaxial growth process, and is formed on both sides of the at least one nanosheet-containing material stack. The source/drain structure 36 grows outward from the physically exposed sidewalls of each semiconductor channel material nanosheet 20. In the logic device region 100 and as is shown in FIG. 6A, one of the source/drain structures 36 grows on top of the logic device region sacrificial placeholder material structure 34S, while the other source/drain structure 26 grows on top of the bottom dielectric isolation layer 16. In the MRAM device region 102 and as is shown in FIG. 6B, one of the source/drain structures 36 grows on top of the MRAM device region sacrificial placeholder material structure 35S, while the other source/drain structure 26 grows on top of the bottom dielectric isolation layer 16. A dopant, as defined above, is typically present during the epitaxial growth process or afterwards by implantation. A recess etch can be employed so as to reduce the height of the source/drain structure 36 such that the same does not extend above the sacrificial gate structure 22.

The ILD material layer 38 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). Although not shown, the ILD material layer 38 can include a multilayered structure that includes at least two different dielectric materials stacked one atop the other such as, for example, silicon nitride and silicon dioxide. The ILD material layer 38 can be formed by a deposition process such as, for example, CVD, PECVD, or spin-on coating. A planarization process (including, for example, chemical mechanical polishing (CMP) is typically performed after the deposition of the dielectric material that provides ILD material layer 38. This planarization process removes the hard mask cap 24 and an upper portion of the dielectric spacer 26 and provides a structure in both the logic device region 100 and the MRAM device region 102 in which the ILD material layer 38 has a topmost surface that is coplanar with a topmost surface of the sacrificial gate structure 22. As is shown in the drawings, the ILD material layer 38 located on top of each of the source/drain structures 36.

Figure 7A:
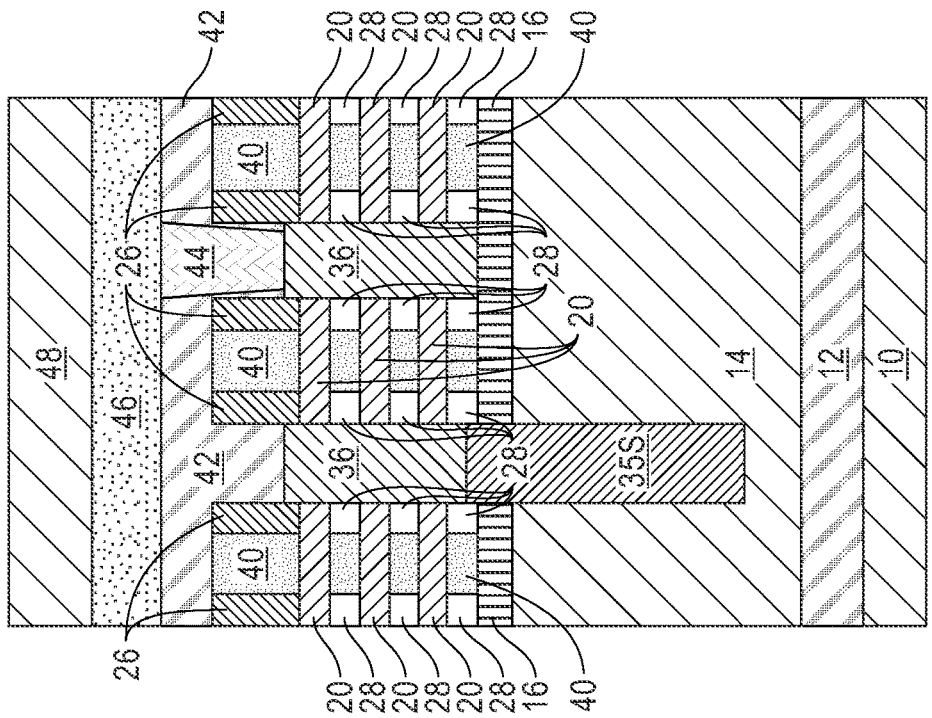
FIGS. 7A and 7B are cross sectional views of the exemplary structure shown in FIGS. 6A and 6B, respectively, after removing the hard mask, the sacrificial gate structure and each recessed sacrificial semiconductor material nanosheet of the at least one nanosheet-containing material stack in both the logic device region and the MRAM device region, forming a functional gate structure wrapping around each semiconductor channel material nanosheet of the at least one nanosheet-containing stack, forming a second ILD material, forming a front side source/drain contact structure, forming a front side BEOL structure and forming a carrier wafer.
Figure 7B:
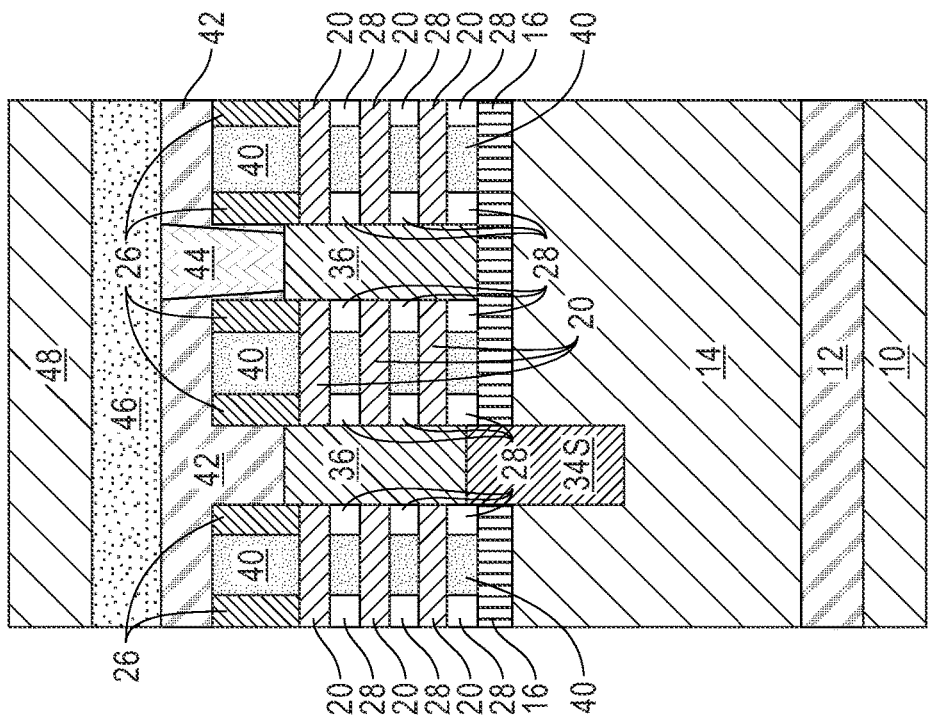

Referring now to FIGS. 7A and 7B, there are illustrated the exemplary structure shown in FIGS. 6A and 6B, respectively, after removing the sacrificial gate structure 22 and each recessed sacrificial semiconductor material nanosheet 18 of the at least one nanosheet-containing material stack in both the logic device region 100 and the MRAM device region 102, forming a functional gate structure 40 wrapping around each semiconductor channel material nanosheet 20 of the at least one nanosheet-containing stack, forming a second ILD material layer, forming a front side source/drain contact structure 44, forming a front side BEOL structure 46 and forming a carrier wafer 48. In the present application, the combination of the first ILD material layer 38 and the second ILD material layer can be referred to as a front side ILD material layer 42.

The sacrificial gate structure 22 and the recessed sacrificial semiconductor material nanosheets 18 are removed by utilizing a first etching process that is selective in removing the sacrificial gate structure 22 and a second etching process that is selective in removing the recessed sacrificial semiconductor material nanosheets 18 relative to the semiconductor channel material nanosheets 20. For example, the second etch can be used to selectively remove SiGe sacrificial semiconductor material nanosheets relative to Si semiconductor channel material nanosheets. Removal of the recessed sacrificial semiconductor material nanosheets 18 provides suspended semiconductor channel material nanosheets 20 in each nanosheet-containing material stack. The removal of the sacrificial gate structure 22 and the recessed sacrificial semiconductor material nanosheets 18 provides a gate opening above and below each suspended semiconductor channel material nanosheet 20 of the nanosheet-containing material stack.

Functional gate structure 40 is then formed into each gate opening. A source/drain structure 36 is located on each side of the functional gate structure 40. The functional gate structure 40 includes at least a gate dielectric material layer and a gate electrode; the gate dielectric material layer and the gate electrode are not separately illustrated in the drawings of the present application. The functional gate structure 40 wraps around the semiconductor channel material nanosheets 20 as shown in FIGS. 7A and 7B. As is known, the gate dielectric material layer of the functional gate structure 40 is in direct contact with physically exposed portions of each semiconductor channel material nanosheet 20, and the gate electrode is located on the gate dielectric material layer. In some embodiments, the gate structure includes a work function metal (WFM) layer (not shown) located between the gate dielectric material layer and the gate electrode. In some embodiments, an optional gate cap (also not shown) can be formed atop the functional gate structure 40.

The forming of the functional gate structure 40 includes forming a continuous layer of gate dielectric material and a gate electrode material inside and the gate opening. The continuous layer of gate dielectric material can include silicon oxide, or a dielectric material having a dielectric constant greater than 4.0 (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSi_O_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The high-k gate dielectric material can further include dopants such as lanthanum (La), aluminum (Al) and/or magnesium (Mg). The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM (work function metal) can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, chemical mechanical polishing (CMP), is used to remove the continuous layer of the gate dielectric material, the optional layer of WFM and the gate electrode material from outside gate opening. The remaining continuous layer of the gate dielectric material that is present inside the gate opening can be referred to as gate dielectric material layer, the remaining optional layer of WFM that is present inside the gate opening can be referred to a WFM layer, and remaining gate electrode material that is present inside the gate opening provides gate electrode of the functional gate structure 40.

When present, gate cap can be composed of a hard mask material such as, for example, silicon dioxide or silicon nitride with or without an air gap, or the gate cap can be composed solely of an air gap. The gate cap can be formed by a deposition process, followed by a planarization process. In embodiments in which a gate cap is employed, a topmost portion of the functional gate structure 40 can be recessed prior to forming the gate cap. In the present application, a topmost surface of the functional gate structure 40, or the gate cap, if present, is coplanar with a topmost surface of the first ILD material layer 38.

Next second ILD material layer is formed on top of the first ILD material layer 38 and on top of the topmost surface of each functional gate structure 40. The second ILD material layer can include one of the dielectric materials mentioned above for the first ILD material layer 38. The dielectric material that provides the second ILD material layer can be compositionally the same as, or compositionally different from, the dielectric material that provides the first ILD material layer 38. Again, the combination of the first ILD material layer 38 and the second ILD material layer provides the front side ILD material layer 42 shown in FIGS. 7A and 7B. The second ILD material layer can be formed utilizing one of the deposition processes mentioned above for forming the first ILD material layer 38.

Front side source/drain contact structure 44 is then formed in each of the logic device region 100 and the MRAM device region 102. As is shown in FIG. 7A, the front side source/drain contact structure 44 in the logic device region 100 extends completely through the front side ILD material layer 42 and directly contacts a surface of one of the source/drain structures 36 that is located on top of the bottom dielectric isolation layer 16. As is shown in FIG. 7B, the front side source/drain contact structure 44 in the MRAM device region 102 extends completely through the front side ILD material layer 42 and directly contacts a surface of one of the source/drain structures 36 that is located on top of the bottom dielectric isolation layer 16. Each front side source/drain contact structure 44 can include a compositionally same, or different, contact conductor material. The contact conductor material can include a conductive metal, such as W, Cu, Al, Co, Ru, Mo, Os, Ir, Rh or an alloy thereof. In embodiments, each front side source/drain contact structure 44 can also include a silicide liner such as TiSi, NiSi, NiPtSi, etc., and an adhesion metal liner, such as TiN. The contact conductor material can be formed by any suitable deposition method such as, for example, ALD, CVD, PVD or plating. Each front side source/drain contact structure can be formed by forming a trench in the front side ILD material layer 42 that physically exposes a surface of the source/drain structure 36 that is located on top of the bottom dielectric isolation layer 16. Each trench is then filled with a contact conductor material, and then planarization to remove any contact conductor material that is located outside the trenches.

In some embodiments (not shown), a metal semiconductor alloy region can be formed in each of the trenches that physically expose the source/drain structure 36 that is located on top of the bottom dielectric isolation layer 16. The metal semiconductor alloy region can be composed of a silicide or germicide. In one or more embodiments of the present application, the metal semiconductor alloy region can be formed by first depositing a metal layer (not shown) in the trenches. The metal layer can include a metal such as Ni, Co, Pt, W, Ti, Ta, a rare earth metal (e.g., Er, Yt, La), an alloy thereof, or any combination thereof. The metal layer can be deposited by ALD, CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the source/drain structure 26 to provide the metal semiconductor alloy region. The unreacted portion of the metal layer, and, if present, the diffusion barrier, are then removed, for example, by an etch process (or a plurality of etching processes). In one embodiment, the etching process can be a wet etch that removes the metal in the metal layer selective to the metal semiconductor alloy in the metal semiconductor alloy regions.

Each the front side source/drain contact structure 44 can include one or more source/drain contact liners (not shown) formed along sidewalls of trenches prior to forming the front side source/drain contact structure 44. In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed.

Front side BEOL structure 46 includes one or more interconnect dielectric material layers that contact one or more wiring regions embedded thereon. The front side BEOL structure 46 can be formed utilizing BEOL processing techniques that are well known to those skilled in the art. The carrier wafer 48 can include one of the semiconductor materials mentioned above for the first semiconductor material layer 10. In the present application, the carrier wafer 48 is typically bonded to the front side BEOL structure 46 after the front side BEOL structure 46 has been formed on the front side ILD material layer 42. As is shown in FIGS. 7A and 7B, each front side source/drain contact structure 44 has a first surface that directly contacts a surface of the front side BEOL structure 46 and a second surface, opposite the first surface, that directly contacts the source/drain structure 36 that is located on top of the bottom dielectric isolation layer 16.

Figure 8A:
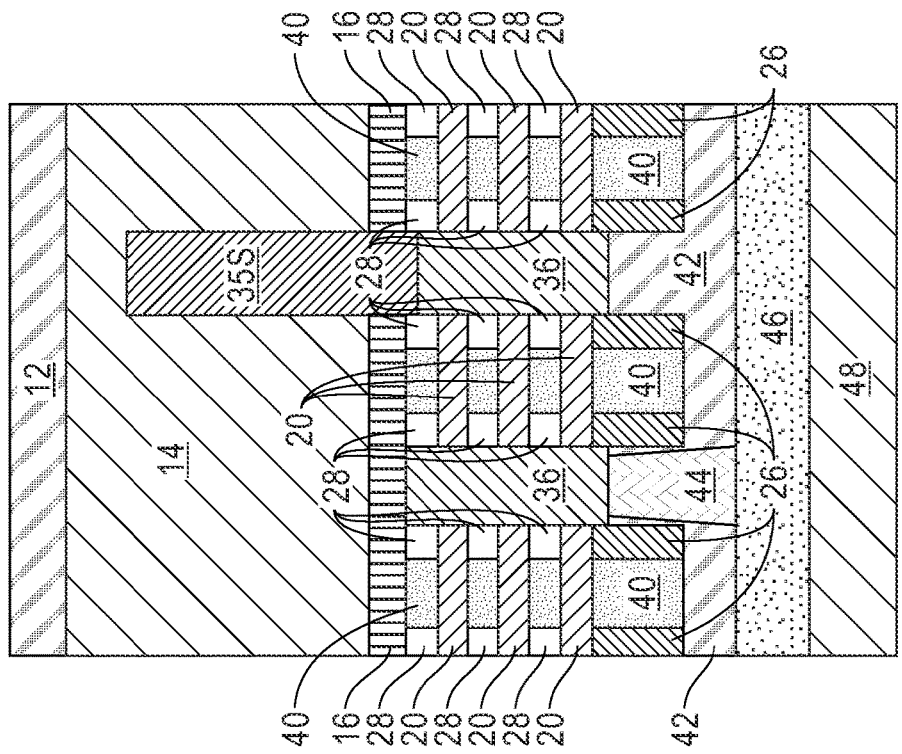
FIGS. 8A and 8B are cross sectional views of the exemplary structure shown in FIGS. 7A and 7B, respectively, after flipping the exemplary structure 180°, and removing the second semiconductor material layer of the semiconductor substrate, wherein the removing stops on the etch stop layer of the semiconductor substrate; after flipping the front side of the wafer is now located beneath the back side of the wafer.
Figure 8B:
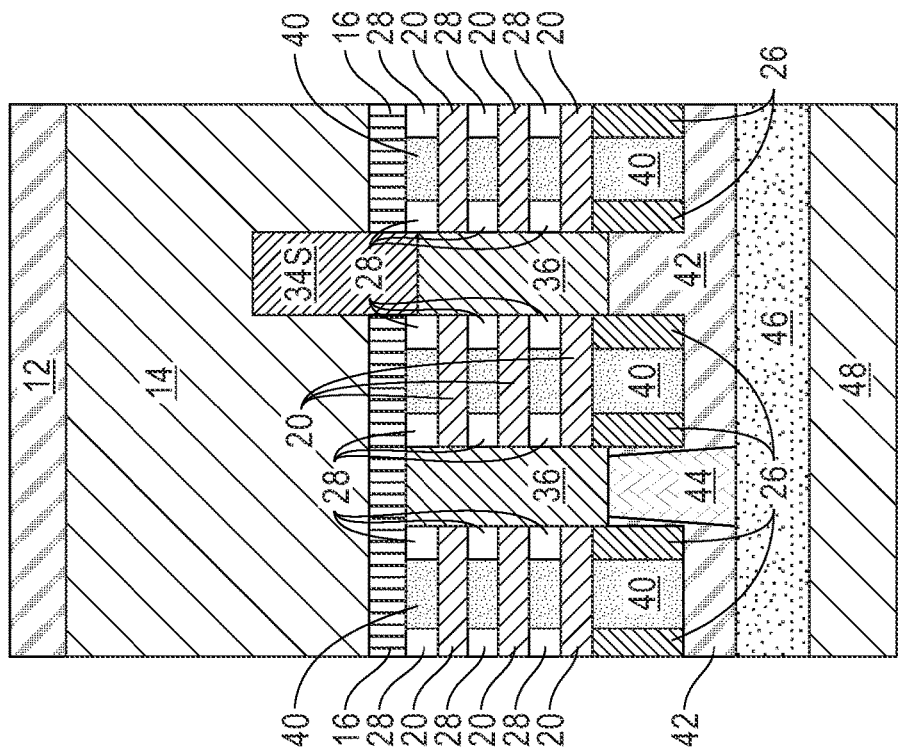

Referring now to FIGS. 8A and 8B, there are illustrated the exemplary structure shown in FIGS. 7A and 7B, respectively, after flipping the exemplary structure 180°, and removing the second semiconductor material layer 14 of the semiconductor substrate, wherein the removing stops on the etch stop layer 12 of the semiconductor substrate. The flipping of the structure can be performed by hand or by utilizing a mechanical means such as, for example, a robot arm. The removal of the second semiconductor material layer 14 can be performed utilizing any material removal process such as, for example, an etch, that is selective in removing the first semiconductor material layer 14.

Figure 9A:
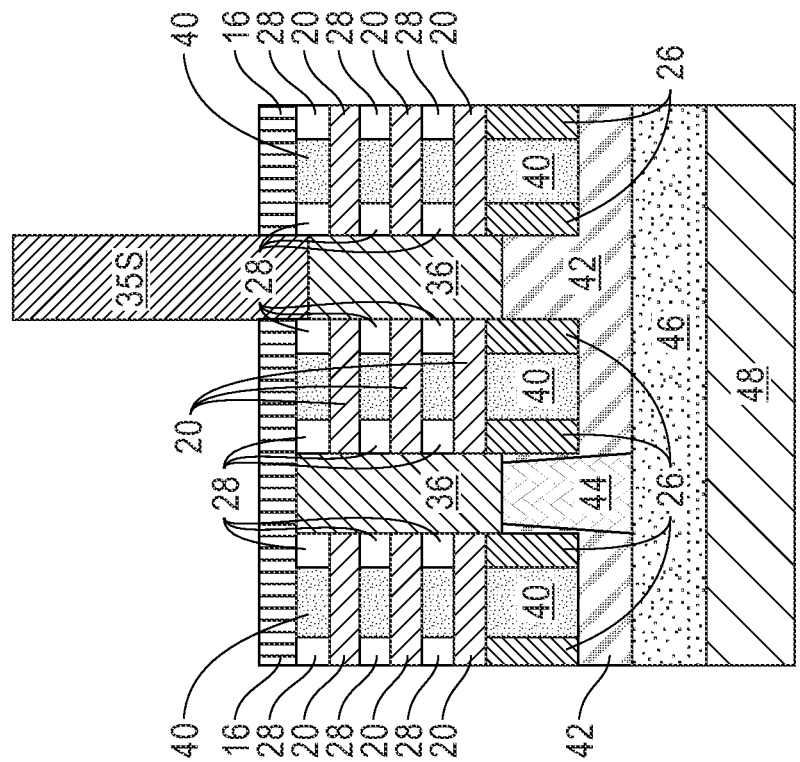
FIGS. 9A and 9B are cross sectional views of the exemplary structure shown in FIGS. 8A and 8B, respectively, after removing the etch stop layer and the first semiconductor material layer of the semiconductor substrate to reveal a portion of the logic device region sacrificial placeholder material structure in the logic device region and a portion of the MRAM device region sacrificial placeholder material structure in the MRAM device region.
Figure 9B:
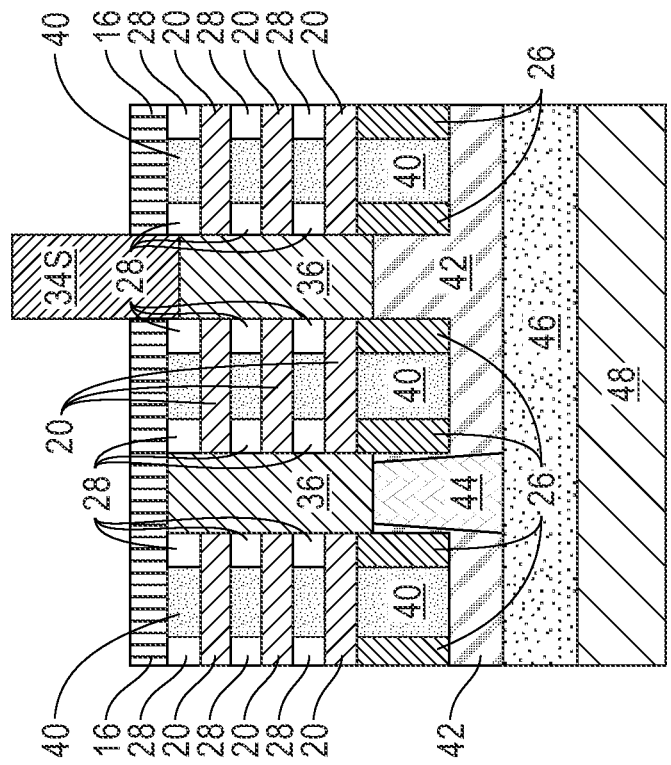

Referring now to FIGS. 9A and 9B, there are illustrated the exemplary structure shown in FIGS. 8A and 8B, respectively, after removing the etch stop layer 12 and the first semiconductor material layer 10 of the semiconductor substrate to reveal a portion of the logic device region sacrificial placeholder material structure 34S in the logic device region 100 and a portion of the MRAM device region sacrificial placeholder material structure 35S in the MRAM device region 102. The removal of the etch stop layer 12 and the first semiconductor material layer 10 can be performed utilizing one or more material removal processes that are selective in removing the etch stop layer 12 and the first semiconductor material layer 10 relative to the logic device region sacrificial placeholder material structure 34S, the MRAM device region sacrificial placeholder material structure 35S and the bottom dielectric isolation layer 16. In one example, a first etch is used to remove the etch stop layer 12, and a second etch, that differs from the first etch, is used to remove the first semiconductor material layer 10.

Figure 10A:
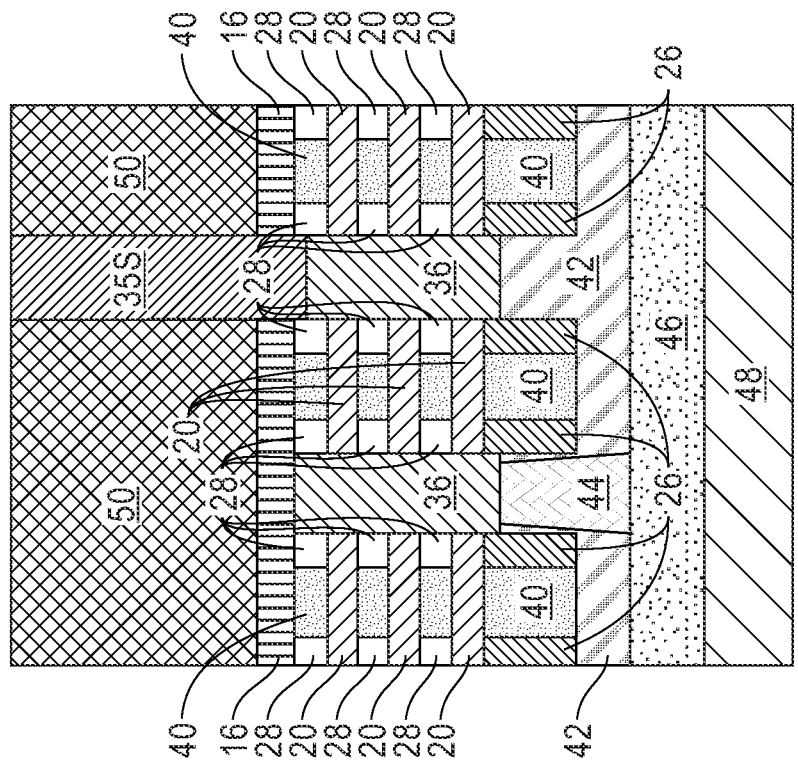
FIGS. 10A and 10B are cross sectional views of the exemplary structure shown in FIGS. 9A and 9B, respectively, after forming a first back side ILD material layer.
Figure 10B:
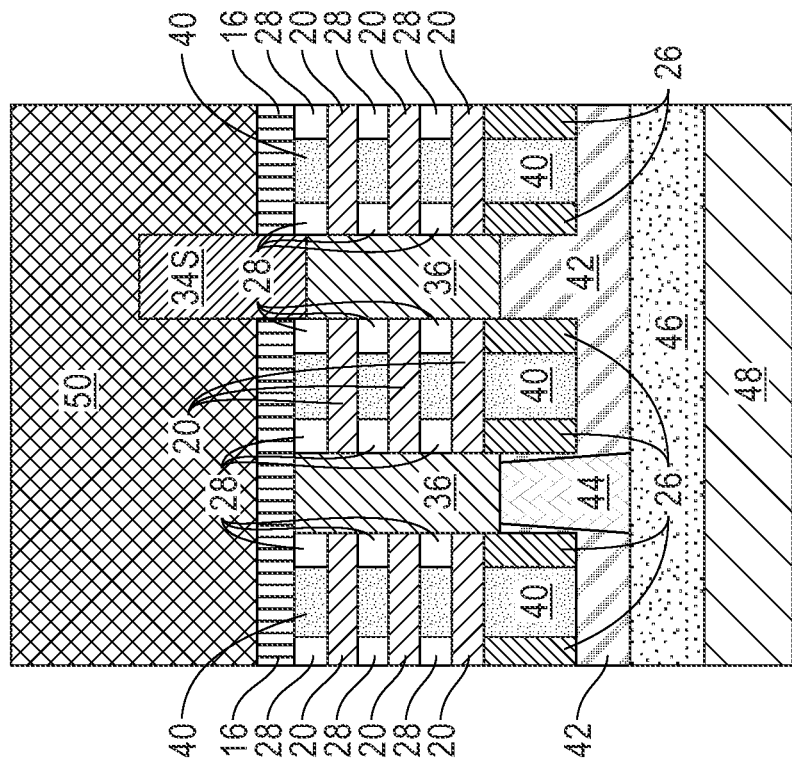

Referring now to FIGS. 10A and 10B, there are illustrated the exemplary structure shown in FIGS. 9A and 9B, respectively, after forming a first back side ILD material layer 50. The back side ILD material layer 50 includes one of the dielectric materials mentioned above for the first ILD material layer 38. The back side ILD material layer 50 can be formed utilizing one of the deposition processes mentioned above in forming the first ILD material layer 38. A planarization process can follow the deposition process so as to reveal the MRAM device region sacrificial placeholder material structure 35S in MRAM device region 102, See FIG. 10B. As is shown in FIG. 10A, no portion of the logic device region sacrificial placeholder material structure 34S is revealed.

Referring now to FIGS. 11A and 11B, there are illustrated the exemplary structure shown in FIGS. 10A and 10B, respectively, after removing the MRAM device region sacrificial placeholder material structure 35S in the MRAM device region 102 to provide an opening 52 that physically exposes a surface of the source/drain structure 36 present in the MRAM device region 102. The physically exposed source/drain structure 36 is located on a side of the functional gate structure 40 that is opposite the side of the functional gate structure 40 that includes the source/drain structure 36 connected to the front side source/drain contact structure 44. Stated in other terms, opening 52 physically exposes the source/drain structure 36 on the opposite side of the nanosheet-containing material stack that contains the front side source/drain contact structure 44 contacting the source/drain structure 36 on that side of the nanosheet-containing material stack. The removal of the MRAM device region sacrificial placeholder material structure 35S in the MRAM device region 102 includes an etching process such as, for example, reactive ion etching, which is selective in removing the MRAM device region sacrificial placeholder material structure 35S in the MRAM device region 102.

Figure 12B:
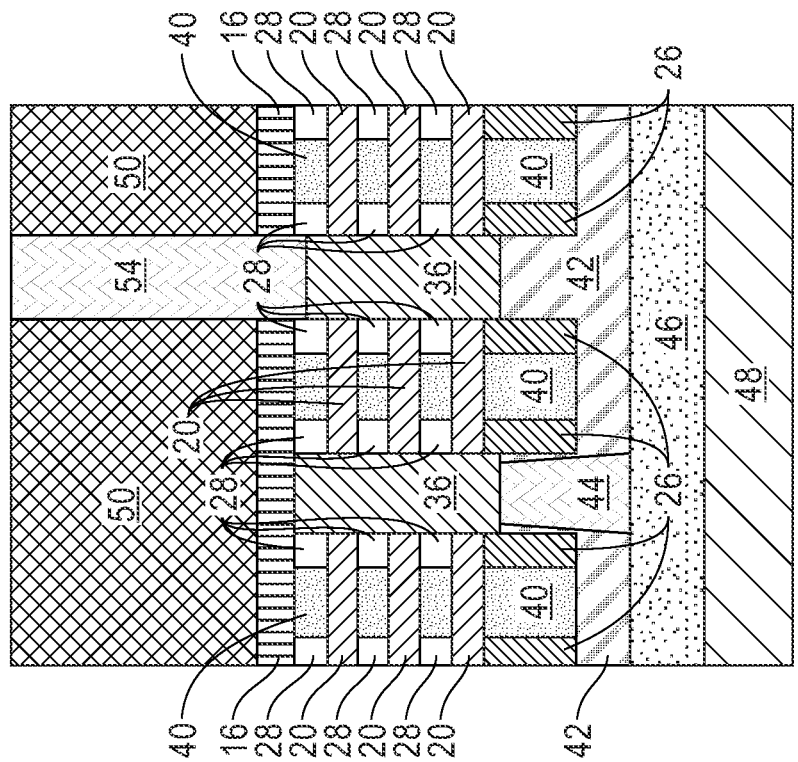
FIGS. 12A and 12B are cross sectional views of the exemplary structure shown in FIGS. 11A and 11B, respectively, after forming a precursor MRAM back side source/drain contact structure in the opening present in the first back side ILD material layer in the MRAM device region.
Figure 12A:
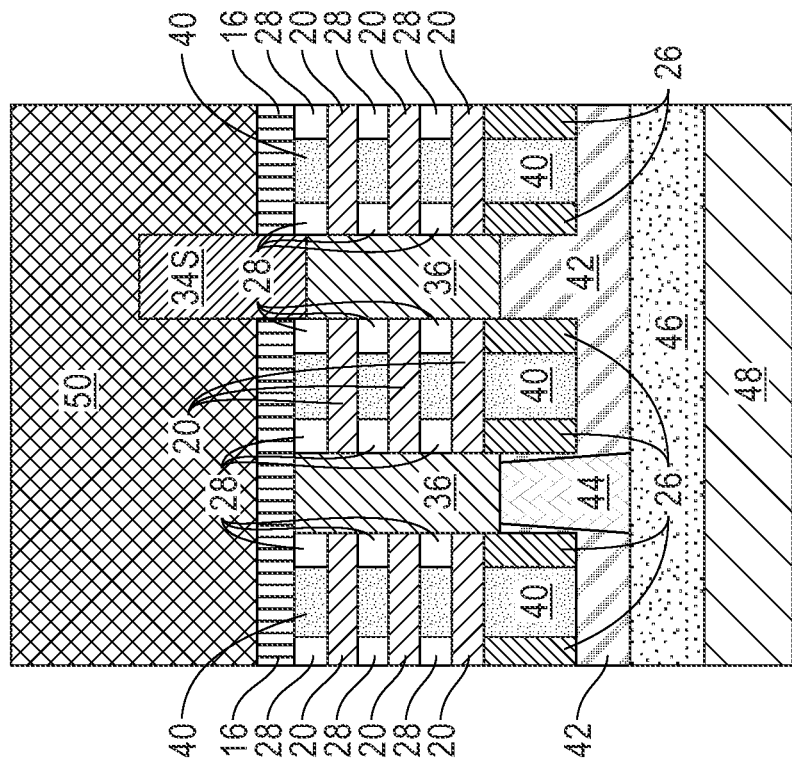

Referring now to FIGS. 12A and 12B, there are illustrated the exemplary structure shown in FIGS. 11A and 11B, respectively, after forming a precursor MRAM back side source/drain contact structure 54 in the opening 52 present in the first back side ILD material layer 50 in the MRAM device region 102. The precursor MRAM back side source/drain contact structure 54 is composed of materials as mentioned above for the front side source/drain contact structure 44. The precursor MRAM back side source/drain contact structure 54 can be formed utilizing the process mentioned above in forming the front side source/drain contact structure 44. The precursor MRAM back side source/drain contact structure 54 has a topmost surface that is coplanar with a topmost surface of the first back side ILD material layer 50.

Figure 13A:
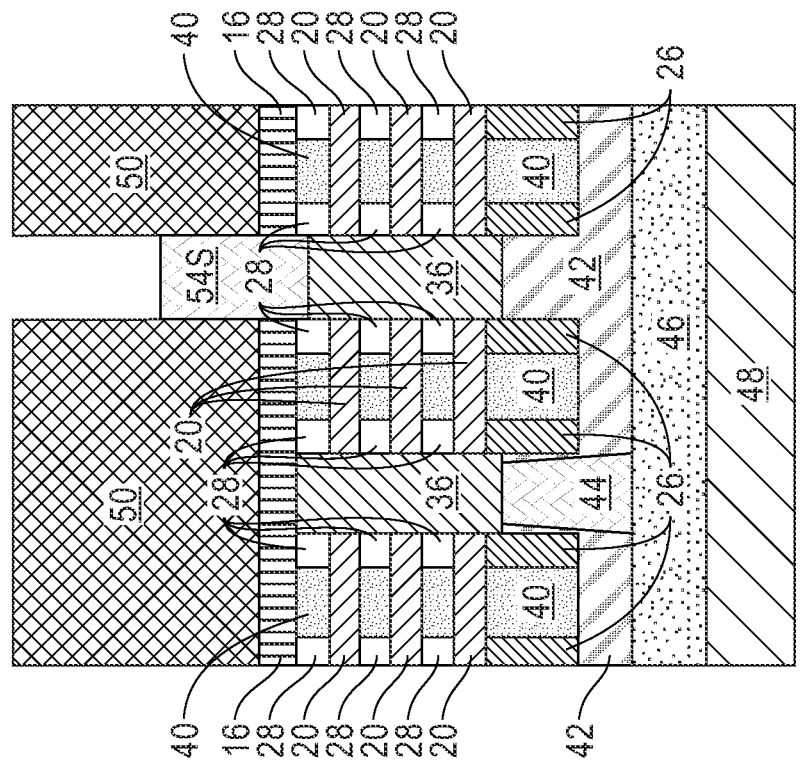
FIGS. 13A and 13B are cross sectional views of the exemplary structure shown in FIGS. 12A and 12B, respectively, after recessing the precursor MRAM back side source/drain contact structure to provide a MRAM back side source/drain contact structure in a lower portion of the opening present in the first back side ILD material layer in the MRAM device region.
Figure 13B:
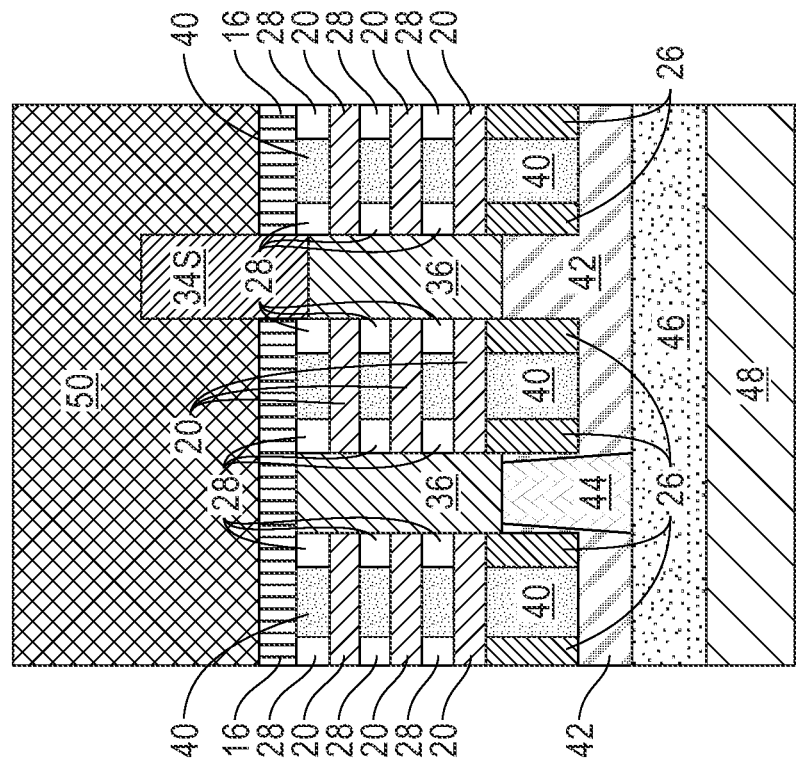

Referring now to FIGS. 13A and 13B, there are illustrated the exemplary structure shown in FIGS. 12A and 12B, respectively, after recessing the precursor MRAM back side source/drain contact structure 54 to provide a MRAM back side source/drain contact structure 54S in a lower portion of the opening 52 present in the first back side ILD material layer 50 in the MRAM device region 102. The recessing of the precursor MRAM back side source/drain contact structure 54 includes any recess etching process that is selective in removing the material/materials that provide the precursor MRAM back side source/drain contact structure 54. The MRAM back side source/drain contact structure 54S has a first surface that extends below the bottom dielectric isolation layer 16 and contacts a surface of the source/drain region 36, and a second surface, opposite the first surface, which is located between a bottommost surface and a topmost surface of the first back side ILD material layer 50.

Figure 14A:
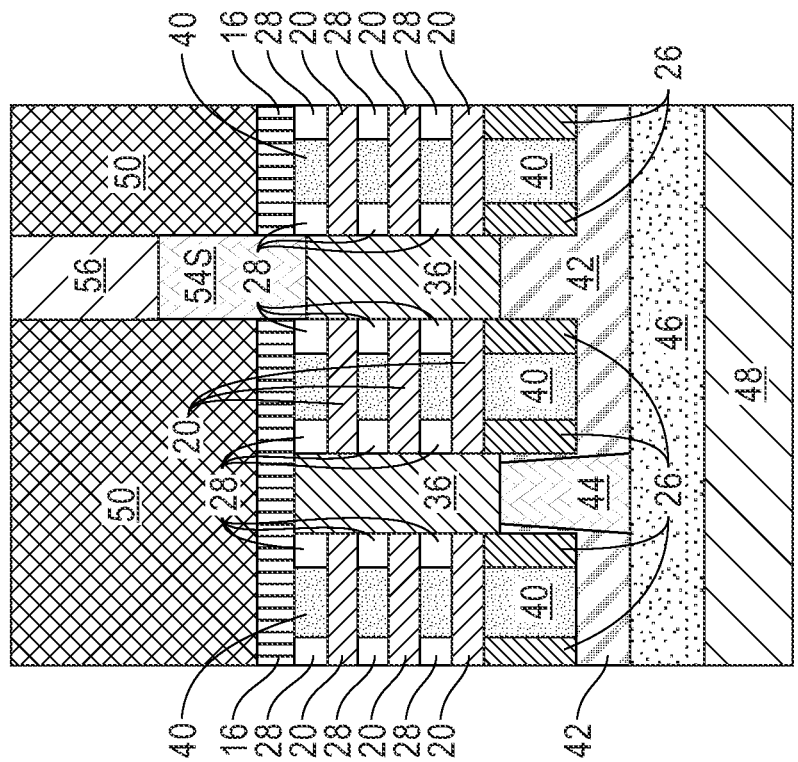
FIGS. 14A and 14B are cross sectional views of the exemplary structure shown in FIGS. 13A and 13B, respectively, after forming a first electrode on the MRAM back side source/drain contact structure and in an upper portion of the opening that is present in the first back side ILD material layer in the MRAM device region.
Figure 14B:
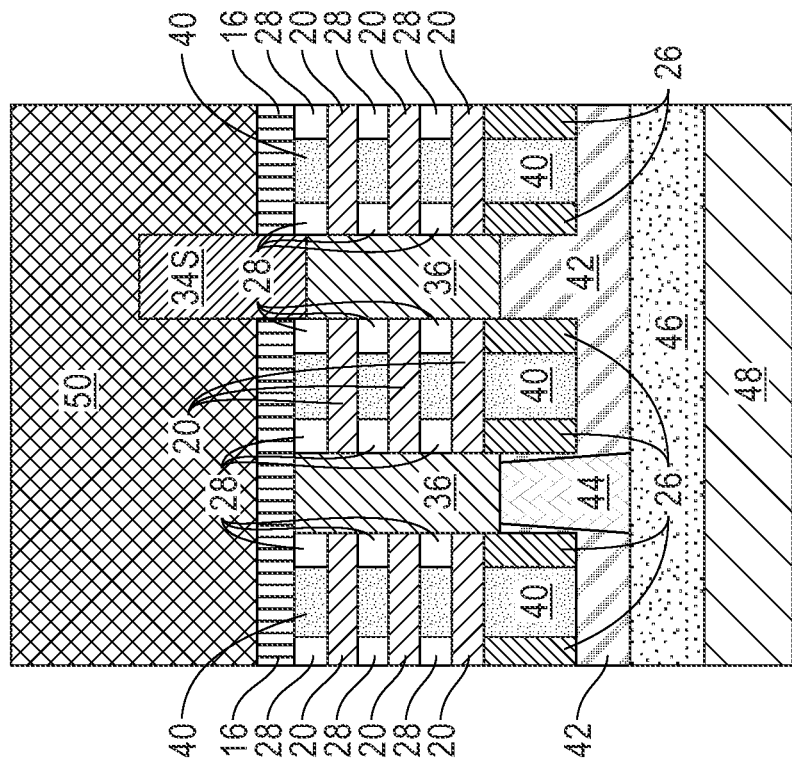

Referring now to FIGS. 14A and 14B, there are illustrated the exemplary structure shown in FIGS. 13A and 13B, respectively, after forming a first electrode 56 on the MRAM back side source/drain contact structure 54. and in an upper portion of the opening 52 present in the first back side ILD material layer 50 in the MRAM device region 102. The first electrode 56 has a topmost surface that is coplanar with a topmost surface of the first back side ILD material layer 50. The first electrode 56 has an outermost sidewall that is substantially aligned with an outermost sidewall of both the MRAM back side source/drain contact structure 54S and the source/drain structure 36 that is located directly beneath the MRAM back side source/drain contact structure 54S. Notably, the first electrode 52, the MRAM back side source/drain contact structure 54S and the source/drain structure 36 that is located directly beneath the MRAM back side source/drain contact structure 54S are self-aligned. The first electrode 56 is composed of an electrically conductive material such as, for example, Ta, TaN, Ti, TiN, Ru, RuN, RuTa, RuTaN, Co, CoWP, CoN, W, WN or any combination thereof. The first electrode 56 can be formed by deposition (including, but not limited to, CVD, PECVD, or ALD) of the electrically conductive material, followed by a planarization process. First electrode 56 will serve as one of the electrodes of a MRAM to be formed in the MRAM device region 102.

Figure 15A:
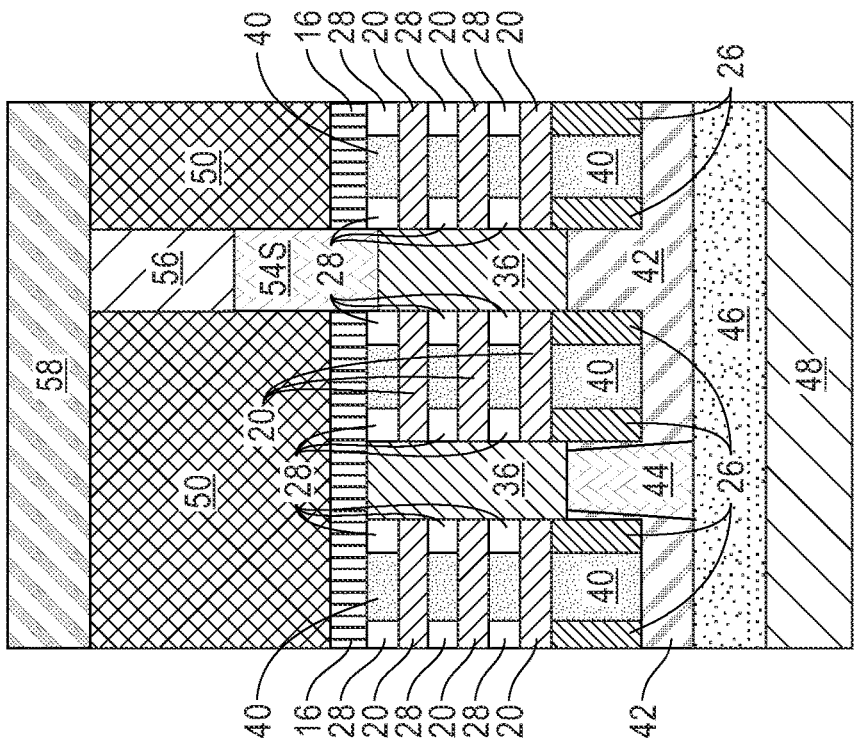
FIGS. 15A and 15B are cross sectional views of the exemplary structure shown in FIGS. 14A and 14B, respectively, after forming a MRAM layered stack in both the logic device region and the MRAM device region.
Figure 15B:
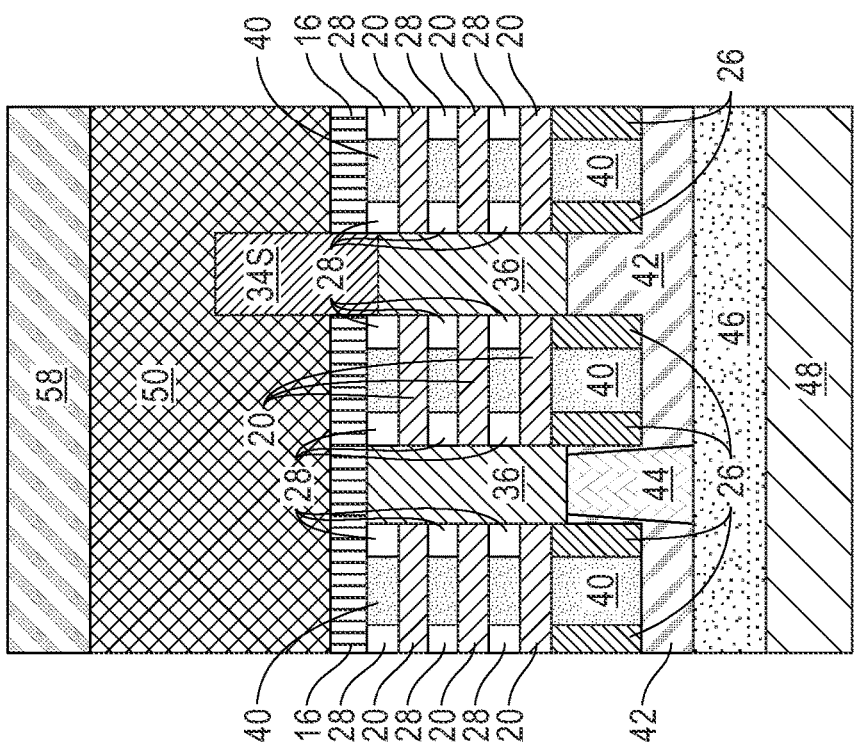

Referring now to FIGS. 15A and 15B, there are illustrated the exemplary structure shown in FIGS. 14A and 14B, respectively, after forming a MRAM layered stack 58 in both the logic device region 100 and the MRAM device region 102. The MRAM layered stack 58 comprises at least a magnetic reference layer, a tunnel barrier layer, and a magnetic free layer. In some embodiments, the MRAM layered stack 58 includes from, bottom to top, the magnetic reference layer, the tunnel barrier layer, and the magnetic free layer. In other embodiments, the MRAM layered stack 58 includes from, bottom to top, the magnetic reference layer, the tunnel barrier layer, and the magnetic free layer. Other well-known MRAM material layers can be formed in the MRAM layered stack 58.

The magnetic reference layer has a fixed magnetization. The magnetic reference layer may be composed of a metal or metal alloy (or a stack thereof) that includes one or more metals exhibiting high spin polarization. In alternative embodiments, exemplary metals for the formation of the magnetic reference layer include iron, nickel, cobalt, chromium, boron, or manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed. The thickness of magnetic reference layer will depend on the material selected. In one example, magnetic reference layer can have a thickness from 0.3 nm to 3 nm.

The tunnel barrier layer is composed of an insulator material and is formed at such a thickness as to provide an appropriate tunneling resistance. Exemplary materials for the tunnel barrier layer include magnesium oxide, aluminum oxide, and titanium oxide, or materials of higher electrical tunnel conductance, such as semiconductors or low-bandgap insulators. The thickness of the tunnel barrier layer will depend on the material selected. In one example, the tunnel barrier layer can have a thickness from 0.5 nm to 1.5 nm.

The magnetic free layer can be composed of a magnetic material (or a stack of magnetic materials) with a magnetization that can be changed in orientation relative to the magnetization orientation of the magnetic reference layer. Exemplary magnetic materials for the magnetic free layer include alloys and/or multilayers of cobalt, iron, alloys of cobalt-iron, nickel, alloys of nickel-iron, and alloys of cobalt-iron-boron. The thickness of magnetic free layer will depend on the material selected. In one example, magnetic free layer can have a thickness from 0.3 nm to 3 nm.

The MRAM layered stack 58 can be formed utilizing one or more deposition processes such as, for example, plating, sputtering, plasma enhanced atomic layer deposition (PEALD), plasma enhanced chemical vapor deposition (PECVD) or PVD.

Figure 16A:
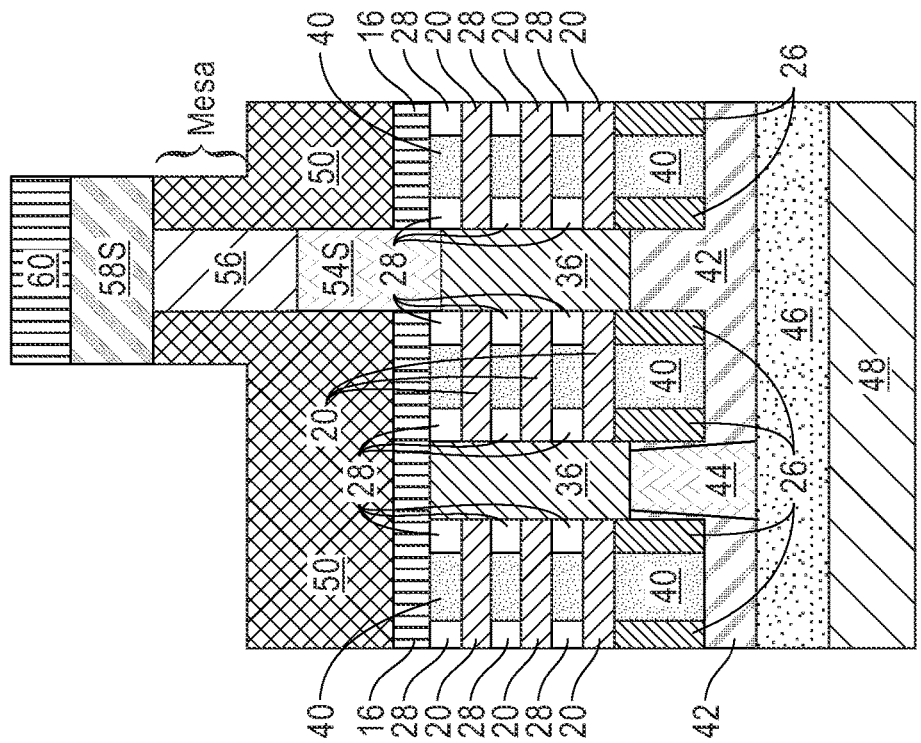
FIGS. 16A and 16B are cross sectional views of the exemplary structure shown in FIGS. 15A and 15B, respectively, after patterning the MRAM layered stack utilizing a second electrode that is formed on atop of the MRAM layered stack in the MRAM device region as an etch mask to provide a MRAM stack in the MRAM device region.
Figure 16B:
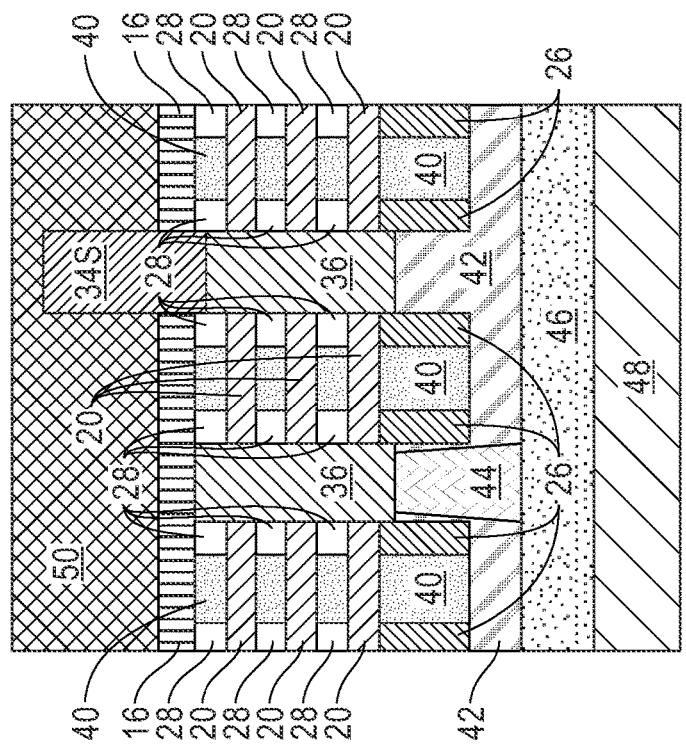

Referring now to FIGS. 16A and 16B, there are illustrated the exemplary structure shown in FIGS. 15A and 15B, respectively, after patterning the MRAM layered stack 58 utilizing a second electrode 60 that is formed on atop of the MRAM layered stack 58 in the MRAM device region 102 as an etch mask to provide a MRAM stack 58S in the MRAM device region 102. Collectively, the first electrode 56, the MRAM stack 58S, and the top electrode 60 provide a MRAM. In some embodiments and as is illustrated in FIG. 16B, the top electrode 60 and MRAM stack 58S have a width that is wider that a width of the first electrode 56. As is further shown in FIG. 16B, a portion of the MRAM stack 56 extends beyond the width of the bottom electrode 56 and this extended portion of the MRAM stack 56 is located on a mesa region of the first back side ILD material layer 50. The second electrode 60 has an outermost sidewall that is substantially vertically aligned to an outermost edge of the MRAM stack 58S.

The patterning of the MRAM layered stack 58 includes forming, via a deposition process, a blanket layer of one of the electrically conductive materials mentioned above for the bottom electrode 56 on the MRAM layered stack 58. After forming the blanket layer of one of the electrically conductive materials mentioned above for the bottom electrode 56, lithography and etching can be used to pattern the blanket layer into second electrode 60. Second electrode 60 is only present in the MRAM device region 102; the blanket layer formed in the logic device region 100 is completely removed as is shown in FIG. 16A. The patterned resist used to pattern the second electrode 60 can be removed by ashing, and thereafter a pattern transfer etch (such as, for example, plasma etching or ion beam etching) is used to pattern the MRAM layered stack 58. During the pattern transfer etch portions of the MRAM layered stack 58 that are not protected by the second electrode 60 are removed. Also, the pattern transfer etch can remove portions of the first back side ILD material layer 50; in the MRAM device region the pattern transfer etch can form a mesa region in the first back side ILD material layer 50 as is illustrated in FIG. 16B. It is noted that no re-sputtering of metal ions occurs in the MRAM device region 102 since the first electrode 56 and MRAM back side source/drain contact structure 54S remain embedded in the first back side ILD material layer 50. Also, no re-sputtering of metal ions from the sacrificial placeholder material structure 34S in the logic device region 100 since the sacrificial placeholder material structure 34S remains embedded in the first back side ILD material layer 50.

Figure 17B:
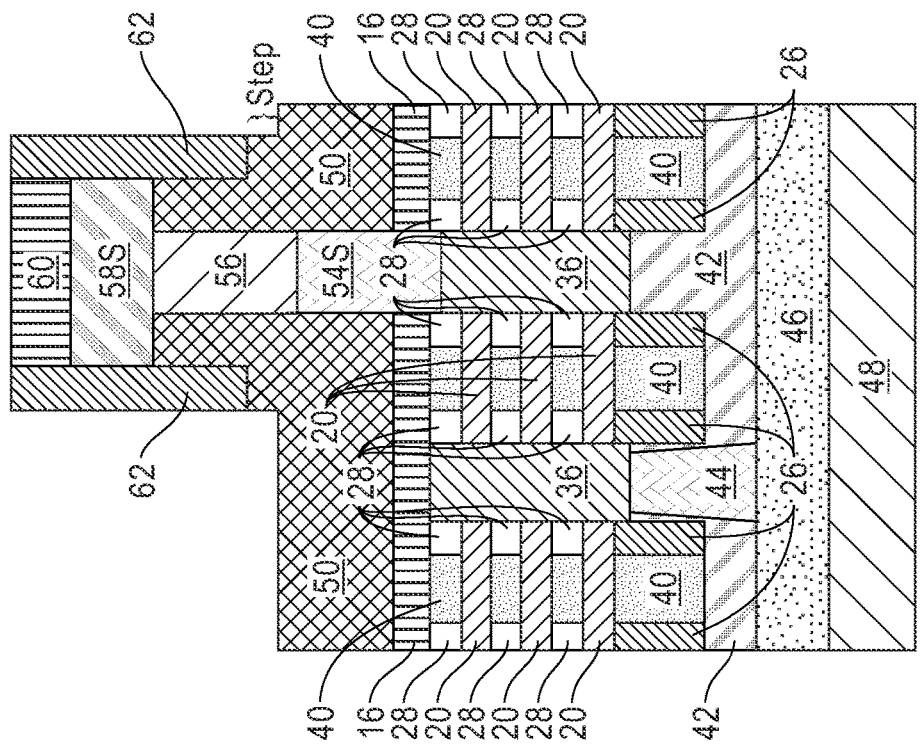
FIGS. 17A and 17B are cross sectional views of the exemplary structure shown in FIGS. 16A and 16B, respectively, after revealing the logic device region sacrificial placeholder material structure, and forming a MRAM spacer laterally adjacent to both the second electrode and the MRAM stack.
Figure 17A:
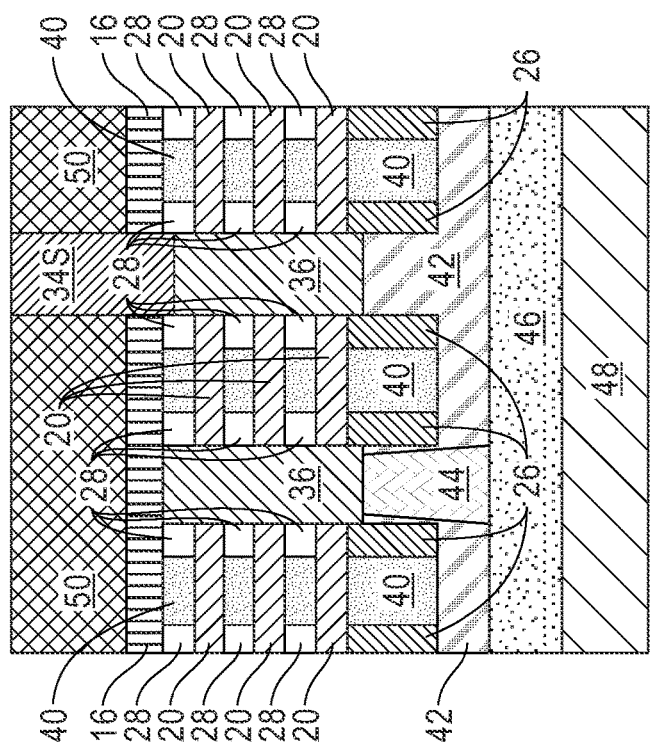

Referring now to FIGS. 17A and 17B, there are illustrated the exemplary structure shown in FIGS. 16A and 16B, respectively, after revealing the logic device region sacrificial placeholder material structure 34S, and forming a MRAM spacer 62 laterally adjacent to both the second electrode 60 and the MRAM stack 62. The revealing of the logic device region sacrificial placeholder material structure 34S includes an etch, such as, for example, a reactive ion etch, that removes an upper portion of the first back side ILD material layer 50. This etch occurs in both the logic device region 100 and the MRAM device region 102. In the MRAM device region 102, this etch creates a step in the first back side ILD material layer 50 as is shown in FIG. 17B. The MRAM spacer 62 is composed of a dielectric material. In one example, the MRAM spacer 62 is composed of silicon nitride. In another example, the MRAM spacer 62 can be composed of a dielectric material that contains atoms of silicon, carbon and hydrogen. In some embodiments, and in addition to atoms of carbon and hydrogen, the dielectric material that provides the MRAM spacer 62 can include atoms of at least one of nitrogen and oxygen. In other embodiments, and in addition to atoms of silicon, nitrogen, carbon and hydrogen, the dielectric material that provides MRAM spacer 62 can include atoms of boron. In one example, the MRAM spacer 62 can be composed of an nBLOK dielectric material that contains atoms of silicon, carbon, hydrogen, nitrogen and oxygen. In alternative example, the MRAM spacer 62 can be composed of a SiBCN dielectric material that contains atoms of silicon, boron, carbon, hydrogen, and nitrogen.

The MRAM spacer 62 can be formed utilizing a deposition process such as, for example, PECVD, PVD, or PEALD, followed by a spacer etch The MRAM spacer 62 can have a thickness from 10 nm to 200 nm. Other thicknesses are possible and can be employed as the thickness of the MRAM spacer 62 MRAM spacer 62. As is shown, the MRAM spacer 62 has a bottom surface that is formed on the step region in the first back side ILD material layer 50 and a topmost surface that is coplanar with the second electrode 60.

Referring now to FIGS. 18A and 18B, there are illustrated the exemplary structure shown in FIGS. 17A and 17B, respectively, after removing the logic device region sacrificial placeholder material structure 34S in the logic device region 100 to reveal the source/drain structure 36 present in the logic device region 100 which is located on a side of the nanosheet-containing material stack not including the front side source/drain contact 44. The removal of the logic device region sacrificial placeholder material structure 34S includes an etch that is selective in removing the logic device region sacrificial placeholder material structure 34S.

Referring now to FIGS. 19A and 19B, there are illustrated the exemplary structure shown in FIGS. 18A and 18B, respectively, after forming a logic device back side source/drain contact structure 64 on the revealed source/drain structure 36 in the logic device region 100. The logic device back side source/drain contact structure 64 includes materials mentioned above for the front side source/drain contact structures 44. The logic device back side source/drain contact structure 64 can be formed by deposition, and an etch back process can follow the deposition to provide the logic device back side source/drain contact structure 64 as shown in FIG. 19A. The logic device back side source/drain contact structure 64 has an outermost sidewall that can be substantially vertically aligned to the outermost surface of the source/drain region 36 that it is in physical contact with. In accordance with the present application, the logic device back side source/drain contact structure 64 has a topmost surface that is located beneath a bottommost surface of the MRAM spacer 62.

Referring now to FIGS. 20A and 20B, there are illustrated the exemplary structure shown in FIGS. 19A and 19B, respectively, after forming a backside power rail 66 in the logic device region 100, a second back side ILD material layer in both the logic device region 100 and the MRAM device region 102, a contact via structure 67 in both the logic device region 100 and the MRAM device region 100, and a back side interconnect structure 70 in both the logic device region 100 and the MRAM device region 102.

The back side power rail 66 is composed of a power rail conductive material. Exemplary power rail conductive materials that can be used in providing the back side power rail 66 include, but are not limited to, tungsten (W), cobalt (Co), ruthenium (Ru), aluminum (Al), copper (Cu), platinum (Pt), rhodium (Rh), or palladium (Pd), with a thin metal adhesion layer (such as TiN, TaN) typically being formed prior to the conductive metal deposition; for clarity, the metal adhesion layer is not separately illustrated in the drawings of the present application. The back side power rail 66 can be formed by first forming a block mask (not shown) in the MRAM device region 102. With this block mask in place, the back side power rail 66 is then formed in the logic device region 100 by a deposition process such as, for example, CVD, PECVD, PVD, sputtering or platting. The block mask is removed after the deposition process. As is shown, the logic device back side source/drain contact structure 64 has a first surface that is in physical contact with the logic device back side source/drain contact 64 and a second surface that is opposite the first surface that is in physical contact with the back side power rail 66.

Second back side ILD material layer is then formed in both the logic device region 100 and the MRAM device region 102. In the logic device region 100, the second back side ILD material layer can be referred to another ILD material layer 68 since it is spaced apart from the first back side ILD material layer 50. In the MRAM device region, the second back side ILD material layer is formed on the first back side ILD material layer 50 forming a MRAM back side ILD material layer stack 69. The MRAM back side ILD material layer stack 69 extends above the second electrode 60 as shown in FIG. 20B. The second back side ILD material layer can include one of the dielectric materials mentioned above for the first ILD material layer 38 and it can be formed by a deposition process as mentioned above in providing the first ILD material layer 38.

A contact via structure 67 is then formed in both the logic device region 100 and the MRAM device region 100. Each contact via structure 67 is composed of an electrically conductive metal or an electrically conductive metal alloy. Exemplary electrically conductive materials that can be used in providing the contact via structure 67 include, but are not limited to, copper (Cu), aluminum (Al), tungsten (W) or a Cu—Al alloy. Each contact via structure 67 can be formed by first providing a contact via opening in the another ILD material layer 68 and in the MRAM back side ILD material layer stack 69. In the logic device region 100, the contact via opening extends down through the another ILD material layer 68 and physically exposes a surface of the back side power rail 66. In the MRAM device region 102, the contact via opening extends down through an upper portion of the MRAM back side ILD material layer stack 69 and the second electrode 60 and physically exposes a topmost surface of the MRAM stack 58S. Next, the electrically conductive material is formed in each of the contact via openings utilizing a deposition process. A planarization process can follow the deposition process. In some embodiments, a diffusion barrier material layer (such as, for example, Ti or Ta) is formed deposited along the sidewalls of each of the contact via openings, followed by deposition of the electrically conductive material, and then followed by a planarization process.

Back side interconnect structure 70 is then formed in both the logic device region 100 and the MRAM device region 102. The back side interconnect structure 70 includes materials as mentioned above for the front side BEOL structure 46. Back side interconnect structure 70 can be formed utilizing techniques well-known in the art. In the logic device region 100, the contact via structure 67 electrically connects the back power rail 66 to the back side interconnect structure 70, while in the logic device region the contact via structure 67 electrically connects the MRAM to the back side interconnect structure.

Notably, FIG. 20B shows a semiconductor structure that includes MRAM (first electrode 56, MRAM stack 58S and second electrode 60) located in MRAM device region 102 and in a back side of a wafer. The structure includes a first back side source/drain contact structure (i.e., MRAM back side source/drain contact structure 54S) directly connecting the first electrode 56 of the MRAM to a first source/drain structure 36 of a first transistor (i.e., the functional gate structure 40 wrapped around the semiconductor channel material nanosheets 20) that is present in the MRAM device region 102. A logic device region 100 can be located laterally adjacent to the MRAM device level and at a same level as the MRAM device region 102.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a magnetoresistive random access memory (MRAM) located in a MRAM device region and in a back side of a wafer, the MRAM comprising a first electrode, a MRAM stack, and a second electrode; and
a first back side source/drain contact structure directly connecting the first electrode of the MRAM to a first source/drain structure of a first transistor that is present in a front side of the wafer and in the MRAM device region, wherein the first back side source/drain contact structure has an outermost sidewall that is substantially vertically aligned to an outermost sidewall of the first electrode.

2. The semiconductor structure of claim 1, wherein the outermost sidewall of the first back side source/drain contact structure is substantially vertically aligned to the outermost sidewall of the first source/drain structure of the first transistor.

3. The semiconductor structure of claim 1, wherein the first transistor comprises a vertical stack of semiconductor channel material nanosheets, and a functional gate structure that wraps around each semiconductor channel material nanosheet of the vertical stack of semiconductor channel material nanosheets.

4. The semiconductor structure of claim 3, further comprising a bottom dielectric isolation layer located on a surface of the first transistor, the bottom dielectric isolation layer having a sidewall in direct physical contact with an outermost sidewall of the first back side source/drain contact structure.

5. The semiconductor structure of claim 3, further comprising an inner spacer located laterally adjacent to the functional gate structure.

6. The semiconductor structure of claim 1, further comprising a second source/drain structure located on a second side of a functional gate structure of the first transistor opposite a first side of the functional gate structure of the first transistor.

7. The semiconductor structure of claim 6, further comprising a first front side source/drain contact structure connecting the second source/drain structure of the first transistor to a front side back-end-of-the-line (BEOL) structure.

8. The semiconductor structure of claim 7, further comprising a carrier wafer located on a surface of the front side BEOL structure.

9. The semiconductor structure of claim 1, further comprising a MRAM spacer located laterally adjacent to, and in direct physical contact with, the MRAM stack and the second electrode, wherein the MRAM spacer is located laterally adjacent to, but spaced apart from the first electrode.

10. The semiconductor structure of claim 9, wherein the MRAM spacer has a bottommost surface that is located between a bottommost surface and a topmost surface of the first electrode.

11. The semiconductor structure of claim 1, further comprising a back side interlayer dielectric (ILD) material layer stack laterally surrounding the MRAM and an upper portion of the first back side source/drain contact structure.

12. The semiconductor structure of claim 1, wherein the second electrode is in electrical contact with a back side interconnect structure.

13. The semiconductor structure of claim 1, further comprising a second transistor located in the front side of the wafer and in a logic device region that is positioned adjacent to the MRAM device region, wherein the second transistor has a first source/drain structure located on a first side of a functional gate structure of the second transistor, and a second source/drain structure located on a second side of the functional gate structure of the second transistor opposite the first side of the functional gate structure of the second transistor.

14. The semiconductor structure of claim 13, further comprising a second back side source/drain contact structure located in the logic device region and connecting the first source/drain structure of the second transistor to a back side power rail.

15. The semiconductor structure of claim 14, wherein the back side power rail is in electrical contact with a back side interconnect structure.

16. The semiconductor structure of claim 15, further comprising a via contact structure located between the back side interconnect structure and the back side power rail.

17. The semiconductor structure of claim 14, wherein the second back side source/drain contact structure has a topmost surface that is located beneath a bottommost surface of a MRAM spacer that surrounds the MRAM device.

18. The semiconductor structure of claim 13, further comprising a front side source/drain contact structure located in the logic device region connecting the second source/drain structure of the second transistor to a front side BEOL structure.

19. The semiconductor structure of claim 18, further comprising a carrier wafer located on a surface of the front side BEOL structure.

20. A semiconductor structure comprising:
a magnetoresistive random access memory (MRAM) device region comprising a MRAM comprising a first electrode, a MRAM stack, and a second electrode, and located in a back side of a wafer, a first transistor having a first source/drain structure located beneath the MRAM, and a first back side source/drain contact structure directly connecting the first electrode of the MRAM to a first source/drain structure of a first transistor, wherein the first back side source/drain contact structure has an outermost sidewall that is substantially vertically aligned to an outermost sidewall of both the first source/drain structure of the first transistor and the first electrode; and
a logic device region located adjacent to the MRAM device region, wherein the logic device region comprises a second transistor located in a front side of the wafer and having a first source/drain structure located on a first side of a functional gate structure of the second transistor, and a second back side source/drain contact structure directly connecting the first source/drain structure of the functional gate structure of second transistor to a back side power rail.

21. The semiconductor structure of claim 20, wherein the second back side source/drain contact structure has a topmost surface that is located beneath a bottommost surface of a MRAM spacer that surrounds the MRAM device.

22. The semiconductor structure of claim 21, wherein the MRAM spacer has a bottommost surface that is located between a bottommost surface and a topmost surface of the first electrode.

23. The semiconductor structure of claim 20, wherein the back side power rail is in electrical contact with a back side interconnect structure that is located on top of the back side power rail, and the second electrode of the MRAM is in electrical contact with the back side interconnect structure that is located on top of the MRAM.

24. A semiconductor structure comprising:
- a magnetoresistive random access memory (MRAM) located in a MRAM device region and in a back side of a wafer, the MRAM comprising a first electrode, a MRAM stack, and a second electrode;
- a first back side source/drain contact structure directly connecting the first electrode of the MRAM to a first source/drain structure of a first transistor that is present in a front side of the wafer and in the MRAM device region,
- a backside interconnect structure located in the backside of the wafer and in electrical contact with the second electrode; and
- a contact via structure that vertically extends through the second electrode, the contact via structure having a first surface in direct contact with the MRAM stack, and a second surface, opposite the first surface, which is in direct contact with the back side interconnect structure.

* * * * *